United States Patent
Yamazaki et al.

(10) Patent No.: US 8,481,363 B2
(45) Date of Patent: *Jul. 9, 2013

(54) SEMICONDUCTOR DEVICE AND MANUFACTURING METHOD THEREOF

(75) Inventors: Shunpei Yamazaki, Setagaya (JP); Hidekazu Miyairi, Isehara (JP); Kengo Akimoto, Atsugi (JP); Kojiro Shiraishi, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 10 days.

This patent is subject to a terminal disclaimer.

(21) Appl. No.: 13/227,585

(22) Filed: Sep. 8, 2011

(65) Prior Publication Data

US 2012/0058599 A1    Mar. 8, 2012

Related U.S. Application Data

(63) Continuation of application No. 12/535,712, filed on Aug. 5, 2009, now Pat. No. 8,030,663.

(30) Foreign Application Priority Data

Aug. 8, 2008    (JP) ................................. 2008-205968

(51) Int. Cl.
*H01L 21/34*    (2006.01)

(52) U.S. Cl.
USPC ........ 438/104; 257/E21.459; 257/78; 257/43; 257/614; 257/E29.296

(58) Field of Classification Search
USPC .............. 438/104; 257/78, 614, 43, E21.459, 257/E29.296
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |

(Continued)

FOREIGN PATENT DOCUMENTS

| | | |
|---|---|---|
| EP | 1 737 044 A | 12/2006 |
| EP | 2 226 847 A | 9/2010 |

(Continued)

OTHER PUBLICATIONS

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

(Continued)

*Primary Examiner* — Victor A Mandala
(74) *Attorney, Agent, or Firm* — Eric J. Robinson; Robinson Intellectual Property Law Office, P.C.

(57) ABSTRACT

The semiconductor device includes a thin film transistor which includes a gate electrode layer, a gate insulating layer over the gate electrode layer, a source electrode layer and a drain electrode layer over the gate insulating layer, a buffer layer over the source electrode layer and the drain electrode layer, and a semiconductor layer over the buffer layer. A part of the semiconductor layer overlapping with the gate electrode layer is over and in contact with the gate insulating layer and is provided between the source electrode layer and the drain electrode layer. The semiconductor layer is an oxide semiconductor layer containing indium, gallium, and zinc. The buffer layer contains a metal oxide having n-type conductivity. The semiconductor layer and the source and drain electrode layers are electrically connected to each other through the buffer layer.

19 Claims, 24 Drawing Sheets

U.S. PATENT DOCUMENTS

| | | | |
|---|---|---|---|
| 5,847,410 A | 12/1998 | Nakajima | |
| 6,294,274 B1 | 9/2001 | Kawazoe et al. | |
| 6,563,174 B2 | 5/2003 | Kawasaki et al. | |
| 6,586,346 B1 | 7/2003 | Yamazaki et al. | |
| 6,727,522 B1 | 4/2004 | Kawasaki et al. | |
| 6,960,812 B2 | 11/2005 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,301,211 B2 | 11/2007 | Yamazaki et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2* | 3/2010 | Akimoto et al. | 438/104 |
| 7,732,819 B2 | 6/2010 | Akimoto et al. | |
| 7,893,431 B2* | 2/2011 | Kim et al. | 257/43 |
| 7,910,490 B2* | 3/2011 | Akimoto et al. | 438/722 |
| 8,030,663 B2* | 10/2011 | Yamazaki et al. | 257/78 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1* | 3/2006 | Hoffman et al. | 257/72 |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0203987 A1 | 8/2008 | Kang et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0065771 A1 | 3/2009 | Iwasaki et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0025678 A1 | 2/2010 | Yamazaki et al. | |
| 2010/0059751 A1* | 3/2010 | Takahashi et al. | 257/57 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2007-250983 A | 9/2007 |
| WO | 2004/114391 | 12/2004 |
| WO | 2007/119386 | 10/2007 |

OTHER PUBLICATIONS

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Osada et al., "15.2: Development of Driver-Integrated Panel using Amorphous In—Ga—Zn-Oxide TFT," SID Digest '09: SID International Symposium Digest of Technical Papers, May 31, 2009, pp. 184-187.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9th International Display Workshops, Dec. 4, 2002, pp. 295-298.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In—Ga—Zn-Oxide TFTs," IDW '09: Proceedings of the $16^{th}$ International Display Workshops, 2009, pp. 689-692.

Park et al., "Amorphous Indium-Gallium-Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Osada et al., "Development of Driver-Integrated Panel using Amorphous In—Ga—Zn-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn-Oxide TFT," SID Digest '09: SID International Symposium Digest of Technical Papers, May 31, 2009, pp. 1110-1112.

Ohara et al., "21.3: 4.0 In. QVGA AMOLED Display Using In—Ga—Zn-Oxide TFTs with a Novel Passivation Layer," SID Digest '09: SID International Symposium Digest of Technical Papers, May 31, 2009, pp. 284-287.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the $13^{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, or Al; B: Mg, Mn, Fe, Ni, Cu, or Zn] at Temperatures Over 1000° C." Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Fortunato et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Son et al., "42.4L: Late-News Paper: 4 Inch QVGA AMOLED Driven by the Threshold Voltage Controlled Amorphous Gizo ($Ga_2O_3$—$In_2O_3$—ZnO) TFT," SID Digest '08: SID International Symposium Digest of Technical Papers, May 20, 2008, vol. 39, pp. 633-636.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Park et al., "High performance amorphous oxide thin film transistors with self-aligned top-gate structure," IEDM 09: Technical Digest of International Electron Devices Meeting, Dec. 7, 2009, pp. 191-194.

Nakamura, "Synthesis of Homologous Compound with New Long-Period Structure," NIRIM Newsletter, Mar. 1, 1995, vol. 150, pp. 1-4.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review B), Oct. 4, 2007, vol. 76, No. 16, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6th International Display Workshops, Dec. 3, 2008, pp. 581-584.

Kim et al., "High-Performance oxide thin film transistors passivated by various gas plasmas," 214th ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

* cited by examiner

SEMICONDUCTOR DEVICE AND MANUFACTURING METHOD THEREOF

BACKGROUND OF THE INVENTION

1. Field of the Invention

The present invention relates to a semiconductor device which has a circuit including a thin film transistor (hereinafter, referred to as a TFT) in which a channel formation region is formed using an oxide semiconductor film and a manufacturing method thereof. For example, the present invention relates to an electronic appliance in which an electro-optical device typified by a liquid crystal display panel or a light-emitting display device including an organic light-emitting element is mounted as its component.

Note that the semiconductor device in this specification indicates all the devices which can operate by using semiconductor characteristics, and an electro-optical device, a semiconductor circuit, and an electronic appliance are all included in the semiconductor devices.

2. Description of the Related Art

In recent years, active-matrix display devices (such as liquid crystal display devices, light-emitting display devices, or electrophoretic display devices) in which a switching element of a TFT is provided for each of display pixels arranged in matrix have been actively developed. In the active-matrix display devices, a switching element is provided for each of pixels (or each of dots), and thus, there is such an advantage that the active matrix display devices can be driven at lower voltage than passive matrix display devices in the case where the pixel density is increased.

In addition, a technique has attracted attention, where a thin film transistor (TFT) or the like in which a channel formation region is formed using an oxide semiconductor film is manufactured and such a TFT or the like is applied to electronic devices or optical devices. For example, a TFT in which zinc oxide (ZnO) is used for an oxide semiconductor film or a TFT in which $InGaO_3(ZnO)_m$ is used for an oxide semiconductor film can be given. A technique in which a TFT including such an oxide semiconductor film is formed over a light-transmitting substrate and used as a switching element or the like of an image display device, is disclosed in Reference 1 and Reference 2.

REFERENCES

Patent Document

[Patent Document 1] Japanese Published Patent Application No. 2007-123861

[Patent Document 2] Japanese Published Patent Application No. 2007-96055

SUMMARY OF THE INVENTION

A thin film transistor using an oxide semiconductor film for a channel formation region is required to operate at high speed, be manufactured through a relatively simple process, and be sufficiently reliable.

In forming a thin film transistor, a metal material having low resistance is used for source and drain electrodes. In particular, in the case of manufacturing display devices performing large-area display, the problem of signal delay due to wiring resistance becomes significant. Therefore, a metal material having low electric resistance is desirably used as a material of a wiring or an electrode. On the other hand, in the case of the thin film transistor structure in which an oxide semiconductor film is directly in contact with source and drain electrodes formed using a metal material having low electric resistance, contact resistance might be high. As one of factors causing high contact resistance, the following condition is given: Schottky junction is formed at the interface between the oxide semiconductor film and the source and drain electrodes.

In addition, capacitance is formed in a portion where the oxide semiconductor film and the source and drain electrodes are directly in contact with each other, and frequency characteristics (referred to as F characteristics) are low, which might hinder high-speed operation of the thin film transistor.

An object of an embodiment of the present invention is to provide a thin film transistor using an oxide semiconductor film containing indium (In), gallium (Ga), and zinc (Zn), in which contact resistance between the oxide semiconductor layer and the source and drain electrodes is reduced, and a method for manufacturing the thin film transistor.

Another object is to improve operation characteristics and reliability of a thin film transistor using an oxide semiconductor film containing In, Ga, and Zn.

Another object is to reduce variations in electrical properties of thin film transistors each using an oxide semiconductor film containing In, Ga, and Zn. In particular, in a liquid crystal display device, in the case where there are large variations between elements, display unevenness due to variations in TFT properties might be caused.

Also in a display device having a light-emitting element, in the case where variations in ON current ($I_{on}$) of TFTs (TFTs in a driver circuit or TFTs provided in a pixel and supplying a current to a light-emitting element) arranged so that a certain current flows to pixel electrodes are large, luminance of a display screen might be varied.

The summary of an embodiment of the present invention is that an inverted-staggered (bottom-gate) thin film transistor is included in which an oxide semiconductor containing In, Ga, and Zn is used as a semiconductor layer and a buffer layer is provided between the semiconductor layer and source and drain electrodes.

In this specification, a semiconductor layer formed using an oxide semiconductor film containing In, Ga, and Zn is also referred to as an "IGZO semiconductor layer".

An ohmic contact of an IGZO semiconductor layer and a source electrode layer is necessary and the contact resistance therebetween is desirably as low as possible. Similarly, an ohmic contact of the IGZO semiconductor layer and a drain electrode layer is necessary and the contact resistance therebetween is desirably as low as possible.

Therefore, an ohmic contact is formed by intentionally providing a buffer layer having a higher carrier concentration than the IGZO semiconductor layer between the IGZO semiconductor layer and a source and drain electrode layers.

For the buffer layer, metal oxide having n-type conductivity is used. As the metal oxide, titanium oxide, molybdenum oxide, zinc oxide, indium oxide, tungsten oxide, magnesium oxide, calcium oxide, tin oxide, or the like can be used for example. The buffer layer may contain an impurity imparting n-type or p-type conductivity. As the impurity element, indium, gallium, aluminum, zinc, tin, or the like can be used.

Since the buffer layer has a higher carrier concentration than the IGZO semiconductor layer and is superior in conductivity, the contact resistance can be reduced as compared to the case of directly attaching the source and drain electrodes to the semiconductor layer.

The buffer layer can also be referred to as a drain region or a source region.

In order to reduce variation in electrical properties of the thin film transistors, it is preferable that the IGZO semiconductor layer be in an amorphous state.

One mode of a semiconductor device disclosed in this specification includes a thin film transistor which includes a gate electrode layer, a gate insulating layer over the gate electrode layer, a source electrode layer and a drain electrode layer over the gate insulating layer, a buffer layer having n-type conductivity over the source electrode layer and the drain electrode layer, and a semiconductor layer over the buffer layer. A part of the semiconductor layer overlapping with the gate electrode layer is over and in contact with the gate insulating layer and is provided between the source electrode layer and the drain electrode layer. The semiconductor layer is an oxide semiconductor layer containing indium, gallium, and zinc. The buffer layer contains a metal oxide having n-type conductivity. The semiconductor layer and the source and drain electrode layers are electrically connected to each other through the buffer layer.

An embodiment of the present invention solves at least one of the above problems.

Further, in the above structure, an another buffer layer having a higher carrier concentration than the semiconductor layer and a lower carrier concentration than the buffer layer may be provided between the semiconductor layer and the buffer layer. The another buffer layer functions as an n layer.

In the above structure, it is preferable that the buffer layer contain titanium. Further, the source and drain electrode layers preferably contain titanium. For example, a stacked-layer of a titanium film, an aluminum film, and a titanium film has low resistance and hillocks are unlikely to be generated in the aluminum film.

Further, a side surface of the source electrode layer and a side surface of the drain electrode layer which is opposite to the side surface of the source electrode layer are covered with the buffer layer. Accordingly, a channel length L of the thin film transistor is the distance between a first buffer layer covering the source electrode layer and a second buffer layer covering the drain electrode layer.

Another mode of the present invention to achieve the above structure is a method for manufacturing a semiconductor device which includes forming a gate electrode layer over a substrate, forming a gate insulating layer over the gate electrode layer, forming a source electrode layer and a drain electrode layer over the gate insulating layer, forming a buffer layer having n-type conductivity over the source electrode layer and the drain electrode layer, and forming a semiconductor layer over the buffer layer. The semiconductor layer is formed using an oxide semiconductor layer containing indium, gallium, and zinc. The buffer layer is formed using a metal oxide having n-type conductivity. The buffer layer has a higher carrier concentration than the semiconductor layer. The semiconductor layer and the source and drain electrode layers are electrically connected to each other through the buffer layer.

Note that in the above manufacturing method, a part of the semiconductor layer overlapping with the gate electrode layer is over and in contact with the gate insulating layer and is provided between the source electrode layer and the drain electrode layer.

The semiconductor layer, the n-type buffer layer, and the source and drain electrode layers may be formed by a sputtering method. It is preferable that the gate insulating layer and the semiconductor layer be formed in an oxygen atmosphere (or an atmosphere which contains oxygen at 90% or higher and a rare gas (argon) at 10% or lower) and that the n-type buffer layer be formed in a rare gas (argon) atmosphere.

Examples of a sputtering method include an RF sputtering method in which a high-frequency power source is used for a sputtering power source, a DC sputtering method, and a pulsed DC sputtering method in which a bias is applied in a pulsed manner. An RF sputtering method is mainly used in the case of depositing an insulating film, and a DC sputtering method is mainly used in the case of depositing a metal film.

In addition, there is also a multi-source sputtering apparatus in which a plurality of targets of different materials can be set. With the multi-source sputtering apparatus, films of different materials can be deposited to be stacked in the same chamber, or a plurality of kinds of materials can be deposited by electric discharge at the same time in the same chamber.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

In addition, as a deposition method by a sputtering method, there are also a reactive sputtering method in which a target substance and a sputtering gas component are chemically reacted with each other during deposition to form a thin compound film thereof, and a bias sputtering method in which voltage is also applied to a substrate during deposition.

By any of a variety of sputtering methods, the semiconductor layer, the buffer layer having n-type conductivity, and the source and drain electrode layers are formed.

A thin film transistor having a small amount of photocurrent, low parasitic capacitance, a high on-off ratio, and favorable dynamic characteristics can be manufactured. Accordingly, a semiconductor device including a thin film transistor having excellent electrical properties and high reliability can be provided.

DETAILED DESCRIPTION OF THE INVENTION

Figure 1A:
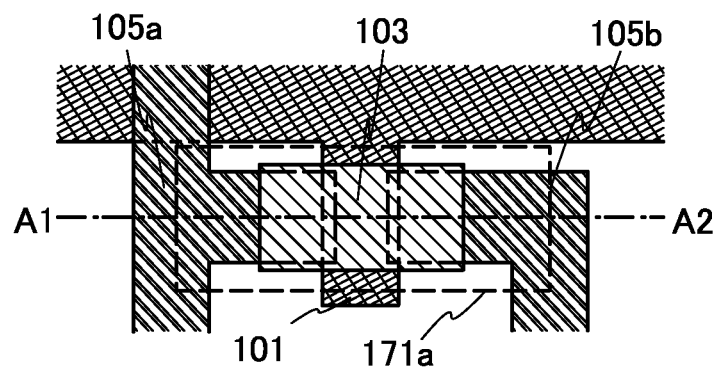
FIGS. 1A and 1B illustrate a semiconductor device according to one aspect of the present invention.

Embodiments of the present invention will be described in detail with reference to the drawings. Note that the present invention is not limited to the following description and it will be readily appreciated by those skilled in the art that modes and details can be modified in various ways without departing from the spirit and the scope of the present invention. Accordingly, the present invention should not be construed as being limited to the description of the embodiments to be given below. Note that in a structure of the present invention described below, like portions or portions having like functions in different drawings are denoted by the like reference numerals and repeated description thereof is omitted.

(Embodiment 1)

In this embodiment, a thin film transistor and a manufacturing process thereof will be described with reference to FIGS. 1A and 1B and FIG. 2.

Figure 1B:
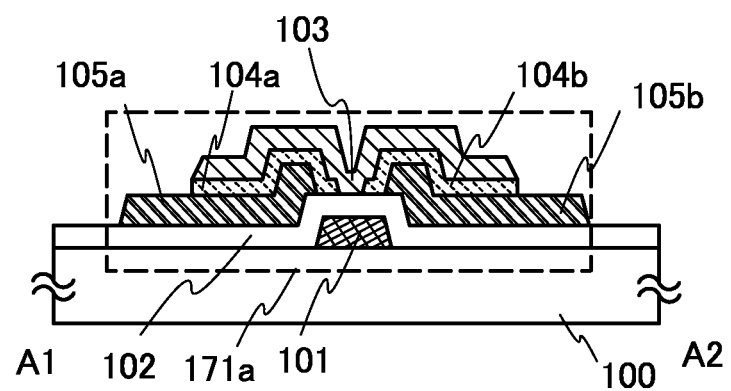
Figure 2:
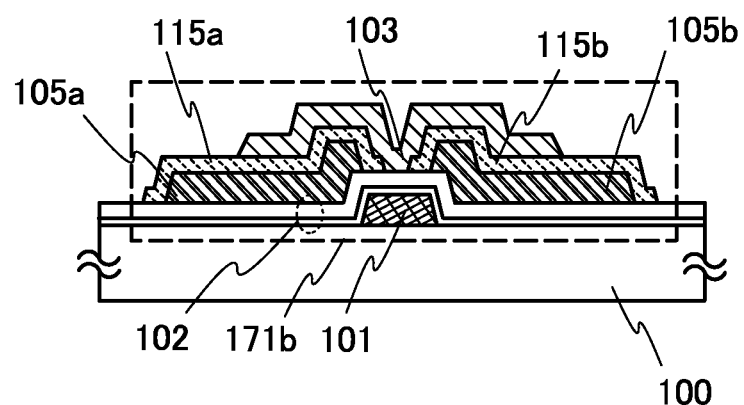
FIG. 2 illustrates a semiconductor device according to one aspect of the present invention.

Thin film transistors 171a and 171b having bottom gate structures of this embodiment are illustrated in FIGS. 1A and 1B and FIG. 2. FIG. 1A is a plan view and FIG. 1B is a cross-sectional view taken along line A1-A2 of FIG. 1A.

In FIGS. 1A and 1B, the thin film transistor 171a that includes a gate electrode layer 101, a gate insulating layer 102, a source and drain electrode layers 105a and 105b, n-type buffer layers 104a and 104b, and a semiconductor layer 103 is provided over a substrate 100.

As the semiconductor layer 103, an oxide semiconductor film containing In, Ga, and Zn is used. The buffer layers 104a and 104b having a higher carrier concentration than the semiconductor layer 103 are intentionally provided between the source and drain electrode layers 105a and 105b and the semiconductor layer 103 that is an IGZO semiconductor layer, whereby an ohmic contact is formed in the thin film transistor 171a.

For the buffer layers 104a and 104b, metal oxide having n-type conductivity is used. As the metal oxide, titanium oxide, molybdenum oxide, zinc oxide, indium oxide, tungsten oxide, magnesium oxide, calcium oxide, or tin oxide can be used for example. In particular, titanium oxide is preferable. The buffer layers 104a and 104b may contain an impurity imparting n-type or p-type conductivity. As the impurity element, indium, gallium, aluminum, zinc, tin, or the like can be used.

In the case where a second buffer layer serving as an n⁻ layer, which has a lower carrier concentration than the buffer layer and a higher carrier concentration than the semiconductor layer, is provided between the semiconductor layer and the buffer layer, the carrier concentration of the second buffer layer may be set between the carrier concentration of the semiconductor layer and the carrier concentration of the buffer layer. In addition, the buffer layer serves as an n⁺ layer.

The buffer layers 104a and 104b can also be referred to as a source and drain regions.

A method for manufacturing the thin film transistor 171a of FIGS. 1A and 1B is described with reference to FIGS. 3A to 3E.

Figure 3A:
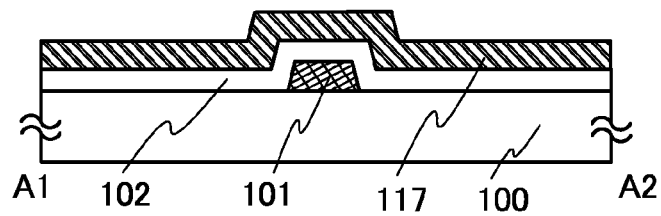
FIGS. 3A to 3E illustrate a method for manufacturing a semiconductor device according to one aspect of the present invention.
Figure 3B:
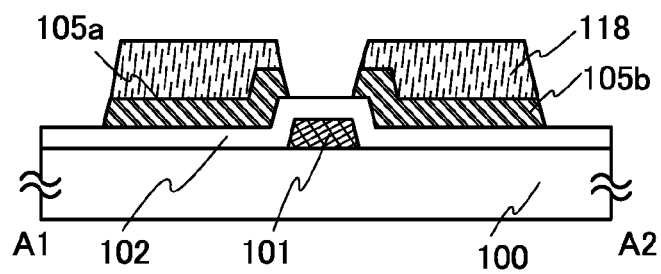

The gate electrode layer 101, the gate insulating layer 102, and a conductive film 117 are formed over the substrate 100 (see FIG. 3A). As the substrate 100, any of the following substrates can be used: non-alkaline glass substrates made of barium borosilicate glass, aluminoborosilicate glass, aluminosilicate glass, or the like by a fusion method or a float method; ceramic substrates; plastic substrates having heat resistance enough to withstand a process temperature of this manufacturing process; and the like. Alternatively, a metal substrate such as a stainless steel alloy substrate, provided with an insulating film on its surface, may also be used. The substrate 100 may have a size of 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, or the like.

In addition, an insulating film may be formed as a base film over the substrate 100. The base film may be formed with a single layer or plural layers of a silicon oxide film, a silicon nitride film, a silicon oxynitride film, and/or a silicon nitride oxide film by a CVD method, a sputtering method, or the like.

The gate electrode layer 101 is formed of a metal material such as titanium, molybdenum, chromium, tantalum, tungsten, or aluminum, or an alloy material thereof. The gate electrode layer 101 can be formed in such a manner that a conductive film is formed over the substrate 100 by a sputtering method or a vacuum evaporation method; a mask is formed over the conductive film by photolithography or ink-jet; and the conductive film is etched using the mask. Alternatively, the gate electrode layer 101 can be formed by discharging a conductive nanopaste of silver, gold, copper, or the like by an ink jet method and baking it. Note that, as a barrier metal which increases adhesion of the gate electrode layer 101 to the substrate or the base film and prevents diffusion of a material of the gate electrode layer 101 to the substrate or the base film, a nitride film of the above-mentioned metal material may be provided between the substrate 100 and the gate electrode layer 101. The gate electrode layer 101 may have a single-layer structure or a multi-layer structure. For example, a structure in which a molybdenum film and an aluminum film are stacked in this order, a structure in which a molybdenum film and an alloy film of aluminum and neodymium are stacked in this order, a structure in which a titanium film and an aluminum film are stacked in this order, a structure in which a titanium film, an aluminum film, and a titanium film are stacked in this order, or the like can be formed over the substrate 100.

Note that, since a semiconductor film and a wiring are to be formed over the gate electrode layer 101, the gate electrode is etched to have a tapered edge, whereby disconnection of a wiring and the like due to a step shape can be prevented The gate insulating layer 102 can be formed by a CVD method, a sputtering method, or the like using a silicon oxide film, a silicon nitride film, a silicon oxynitride film, or a silicon nitride oxide film. The thin film transistor 171b of FIG. 2 shows an example in which the gate insulating layer 102 has a multi-layer structure.

As the gate insulating layer 102, a silicon nitride film or a silicon nitride oxide film, and a silicon oxide film or a silicon oxynitride film may be stacked in this order. Note that the gate insulating layer 102 is not limited to a two-layer structure, and may have a three-layer structure in which a silicon nitride film or a silicon nitride oxide film, a silicon oxide film or a silicon oxynitride film, and a silicon nitride film or a silicon nitride oxide film are stacked in this order over the substrate. Alternatively, the gate insulating layer 102 may have a single-layer structure of a silicon oxide film, a silicon nitride film, a silicon oxynitride film, or a silicon nitride oxide film.

The gate insulating layer 102 is preferably formed under an oxygen atmosphere (or an atmosphere containing oxygen at 90% or higher and a rare gas (such as argon or helium) at 10% or lower).

Alternatively, as the gate insulating layer 102, a silicon nitride film may be formed over the gate electrode layer 101 by a plasma CVD method, and a silicon oxide film may be formed over the silicon nitride film by a sputtering method. Further alternatively, a silicon nitride film and a silicon oxide film may be stacked in this order over the gate electrode layer 101 by a plasma CVD method, and a silicon oxide film may be further stacked over the silicon oxide film by a sputtering method.

In this specification, a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Alternatively, the gate insulating layer 102 may be formed using one kind of oxide, nitride, oxynitride, or nitride oxide of aluminum, yttrium, or hafnium; or a compound including at least two or more kinds of these compounds.

A halogen element such as chlorine or fluorine may be contained in the gate insulating layer 102. The concentration of the halogen element in the gate insulating layer 102 may be from $1\times10^{15}$ atoms/cm$^3$ to $1\times10^{20}$ atoms/cm$^3$, inclusive, at the concentration peak.

The conductive film 117 is preferably formed using a single layer or plural layers of aluminum, or an aluminum alloy to which an element improving heat resistance or an element preventing a hillock, such as copper, silicon, titanium, neodymium, scandium, or molybdenum, is added. Alternatively, the conductive film 117 may have a multi-layer structure where a film on the side touching an n-type buffer layer to be formed later is formed from titanium, tantalum, molybdenum, tungsten, or nitride of any of these elements and an aluminum film or an aluminum alloy film is formed thereover. Further alternatively, the conductive film 117 may have a multi-layer structure where the top and bottom surfaces of aluminum or an aluminum alloy are each covered with titanium, tantalum, molybdenum, tungsten, or nitride thereof. Here, a multi-layer conductive film of a titanium film, an aluminum film, and a titanium film is used as the conductive film 117.

A multi-layer structure of a titanium film, an aluminum film, and a titanium film has a low resistance and a hillock is hardly generated in the aluminum film.

In particular, a layer in contact with the buffer layers 104a and 104b is preferably a titanium film.

The conductive film 117 is formed by a sputtering method or a vacuum evaporation method. Alternatively, the conductive film 117 may be formed by discharging a conductive nanopaste of silver, gold, copper, or the like by a screen printing method, an ink jet method, or the like and baking it.

Next, a mask 118 is formed over the conductive film 117. The conductive film 117 is processed by etching with use of the mask 118, whereby the source and drain electrode layers 105a and 105b are formed (see FIG. 3B).

Then, the mask 118 is removed, and a film containing metal oxide having n-type conductivity is formed over the source and drain electrode layers 105a and 105b. For example, the film may be formed by a sputtering method or a pulsed laser deposition (PLD) method. Here, the top and side surfaces of the source and drain electrode layers 105a and 105b are covered with the film containing metal oxide having n-type conductivity, and thus, the film containing metal oxide having n-type conductivity can protect the source and drain electrode layers 105a and 105b.

Figure 3C:
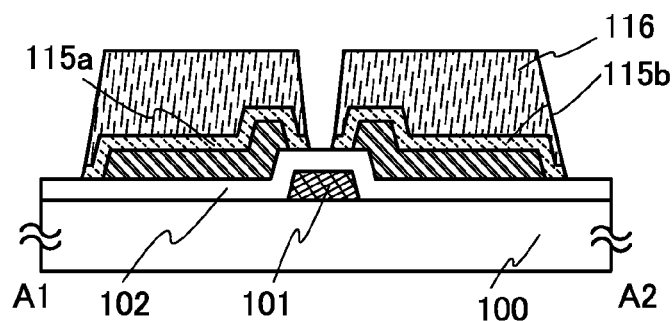

Next, a mask 116 is formed over the film containing metal oxide having n-type conductivity, and the film containing metal oxide having n-type conductivity is processed by etching with use of the mask 116, whereby layers 115a and 115b containing metal oxide are formed (see FIG. 3C). As a method of etching titanium oxide, a wet etching method can be given for example. A diluted hydrofluoric acid, a diluted hydrochloric acid, a diluted sulfuric acid, or a solution in which ammonia water, hydrogen peroxide water, and pure water are mixed at a volume ratio of 1:1:5 can be used as an etchant.

In FIG. 3C, the layers 115a and 115b containing metal oxide are patterned to cover the source and drain electrode layers 105a and 105b to protect them. Note that the shape of the layers 115a and 115b containing metal oxide having n-type conductivity is not limited to the patterned shape illustrated in FIG. 3C. At least the side surfaces of the source and drain electrode layers 105a and 105b which are closer to the gate electrode need to be covered with the layers 115a and 115b containing metal oxide having n-type conductivity; however, the side surfaces of the source and drain electrode layers 105a and 105b far from the gate electrode are not necessarily covered with the layers 115a and 115b containing metal oxide having n-type conductivity. If the side surfaces of the source and drain electrode layers 105a and 105b which are closer to the gate electrode are not covered with the layers 115a and 115b containing metal oxide having n-type conductivity, the side surfaces directly touch the IGZO film forming a channel, which may result in the formation of Schottky junction to increase the contact resistance.

The distance between the layers 115a and 115b containing metal oxide which are formed by etching the film containing metal oxide having n-type conductivity is the channel length of the thin film transistor. If the distance between the layers 115a and 115b containing metal oxide is fixed and exists above the gate electrode, substantially the same electrical properties can be obtained even when misalignment occurs, which allows the variations in thin film transistors to be reduced. In addition, the distance between the layers 115a and 115b containing metal oxide can be freely determined depending on the etching conditions. In conventional thin film transistors, the distance between the source electrode layer and the drain electrode layer is the channel length. In that case, since a metal film with high conductivity or a metal film on which hillocks are easily generated is used, a short circuit between the source electrode layer and the drain electrode layer may occur when the distance therebetween is small.

Figure 3D:
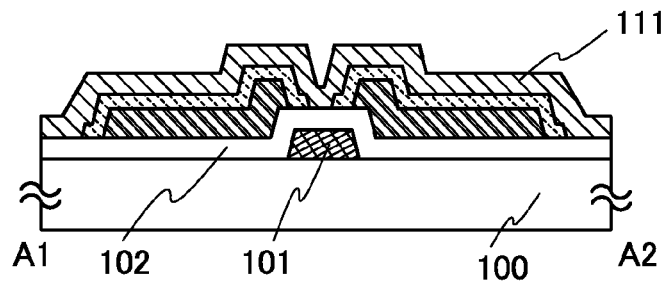

Next, the mask 116 is removed, and a semiconductor film 111 is formed over the layers 115a and 115b containing metal oxide (see FIG. 3D).

As the semiconductor film 111, an oxide semiconductor film containing In, Ga, and Zn is formed. For example, as the semiconductor film 111, an oxide semiconductor film containing In, Ga, and Zn may be formed to a thickness of 50 nm by a sputtering method. The semiconductor film 111 is preferably formed under an oxygen atmosphere (or an atmosphere containing oxygen at 90% or higher and a rare gas (such as argon or helium) at 10% or lower).

Oxide semiconductor films such as the semiconductor film 111 can be formed by a vapor phase method such as a pulsed laser deposition (PLD) method or an electron beam evaporation method, as well as by a sputtering method. Among the vapor phase methods, a PLD method is suitable in terms of easy control of the composition of materials, and a sputtering method is suitable in terms of mass productivity as described above.

The semiconductor film 111 can be specifically formed under the following conditions: an oxide semiconductor target containing In, Ga, and Zn, which has a diameter of 8 inches, is used, the distance between the substrate and the target is 170 mm, the pressure is 0.4 Pa, direct current (DC) power source is 0.5 kW, and the formation is performed under an argon or oxygen atmosphere. In addition, a pulsed direct current (DC) power source is preferably used so that dust can be reduced and even distribution of thickness can be achieved.

Figure 3E:
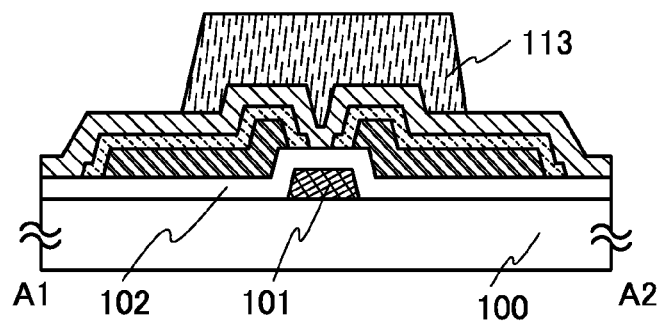

Next, a mask 113 for processing the semiconductor film 111 is formed (see FIG. 3E). By etching the semiconductor film 111 using the mask 113, the semiconductor layer 103 can be formed. Note that in etching of IGZO semiconductor films such as the semiconductor film 111, organic acid such as citric acid or oxalic acid can be used for etchant. For example, the semiconductor film 111 with a thickness of 50 nm can be processed by etching with use of ITO07N (manufactured by KANTO CHEMICAL CO., INC.) in 150 seconds.

The buffer layers 104a and 104b are also formed by etching using the same mask 113. Accordingly, as illustrated in FIGS. 1A and 1B, the edges of the semiconductor layer 103 are substantially aligned with the edges of the buffer layers 104a and 104b. If titanium oxide is used for the buffer layers, for example, a diluted hydrofluoric acid, a diluted hydrochloric acid, a diluted sulfuric acid, or a solution in which ammonia water, hydrogen peroxide water, and pure water are mixed at a volume ratio of 1:1:5 can be used as an etchant.

The semiconductor layer 103 is etched to have a tapered edge, whereby disconnection of a wiring due to a step shape can be prevented.

After that, the mask 113 is removed. Through the above process, the thin film transistor 171a can be formed. Note that the channel length L of the thin film transistor 171a corresponds to the distance between the layers 115a and 115b containing metal oxide (the distance between the buffer layers 104a and 104b). Therefore, the distance between the source and drain electrode layers 105a and 105b can be increased without changing the distance between the layers 115a and 115b containing metal oxide. An increase in the distance between the source and drain electrode layers 105a and 105b can prevent generation of hillocks and a short circuit between the source electrode layer and the drain electrode layer. Moreover, an increase in the distance between the source and drain electrode layers 105a and 105b can reduce the area of the source and drain electrode layers 105a and 105b which overlaps with the gate electrode, and thus reduce the parasitic capacitance with the gate electrode. Accordingly, a thin film transistor with good dynamic characteristics, for example, with high frequency characteristics (referred to as F characteristics) can be obtained.

Further, an insulating film may be formed as a protective film over the thin film transistor 171a. The protective film can be formed in a manner similar to the gate insulating layer. Note that the protective film is provided to prevent entry of impurities floating in the air, such as an organic substance, a metal substance, or moisture, and is preferably a dense film. For example, a silicon oxide film and a silicon nitride film may be stacked over the thin film transistor 171a to be used as the protective film.

Further, it is preferable that heat treatment be performed on the oxide semiconductor films such as the semiconductor layer 103. Heat treatment may be performed in any step after the film formation step, and it can be performed immediately after the oxide semiconductor films are formed, after the protective film is formed, or the like. Further, such heat treatment may also be combined with another heat treatment. The heating temperature may be from 300° C. to 400° C., inclusive, and preferably, 350° C. The heat treatment may be performed plural times so that heat treatment of the semiconductor layer 103 and heat treatment of the buffer layers 104a and 104b are performed in different steps. The heat treatment of the semiconductor layer 103 improves properties of the thin film transistors. Specifically, ON current is increased and variation of properties of transistors are reduced.

A manufacturing process of the thin film transistor 171b illustrated in FIG. 2 will be described with reference to FIGS. 3A to 3E. Only a part of the manufacturing process of the thin film transistor 171b illustrated in FIG. 2 is different from the manufacturing process of the thin film transistor 171a of FIG. 1B; thus, the different part will be described below.

FIG. 2 is different from FIG. 1B in that the gate insulating layer 102 has a two-layer structure and the edges of the buffer layers are not aligned with the edges of the semiconductor layer.

In the etching with use of the mask 113 illustrated in FIG. 3E, only the semiconductor layer 103 is selectively etched so that the layers 115a and 115b containing metal oxide remain, whereby the thin film transistor 171b of FIG. 2 can be obtained. In FIG. 2, the layers 115a and 115b containing metal oxide serve as buffer layers. In the case where an interlayer insulating film is further formed over the thin film transistor 171b and a wiring is formed over the interlayer insulating film, even if the layers 115a and 115b containing metal oxide remain at the bottom of contact holes, a good electrical connection between the wiring and the source and drain electrode layers can be achieved.

In the case of a structure where a gate electrode layer, a gate insulating layer, a source and drain electrode layers, a semiconductor layer (an oxide semiconductor layer containing In, Ga, and Zn) are stacked without a buffer layer (a layer containing metal oxide), the distance between the gate electrode layer and the source or drain electrode layer is small so that parasitic capacitance generated between the gate electrode layer and the source or drain electrode layer increases. Furthermore, this increase in parasitic capacitance becomes significant with decrease of the thickness of the semiconductor layer. In this embodiment, the buffer layer having a high carrier concentration, which is a layer containing metal oxide having n-type conductivity, is provided, and the thin film transistor has a structure where the gate electrode layer, the gate insulating layer, the source and drain electrode layers, the buffer layer, and the semiconductor layer are stacked. Therefore, parasitic capacitance can be suppressed even if the semiconductor layer has a small thickness.

According to this embodiment, a thin film transistor with small photoelectric current, small parasitic capacitance, and a high on-off ratio can be obtained, so that a thin film transistor with good dynamic characteristics can be manufactured. Thus, a semiconductor device including a thin film transistor with high electrical properties and high reliability can be provided.

(Embodiment 2)

In this embodiment, a thin film transistor having a multi-gate structure will be described. Accordingly, except the gate electrode layer, the thin film transistor can be formed in a manner similar to Embodiment 1, and repetitive description of the same portions or portions having functions similar to those in Embodiment 1 and manufacturing steps thereof will be omitted.

In this embodiment, a thin film transistor included in a semiconductor device will be described with reference to FIGS. 4A and 4B and FIGS. 5A and 5B.

Figure 4A:
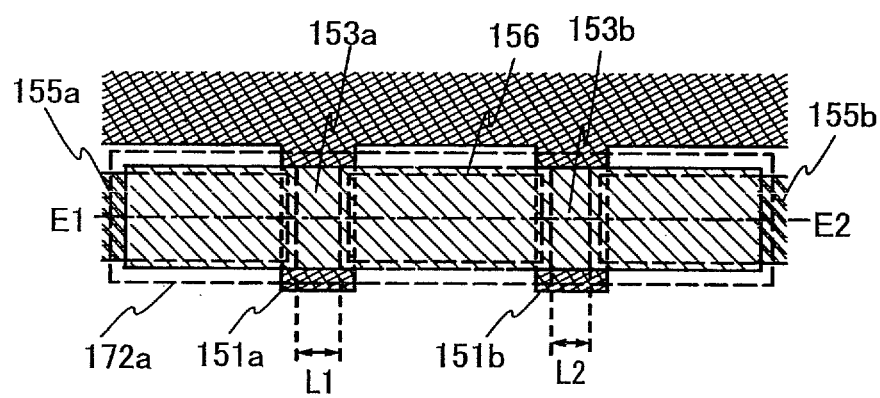
FIGS. 4A and 4B illustrate a semiconductor device according to one aspect of the present invention.
Figure 4B:
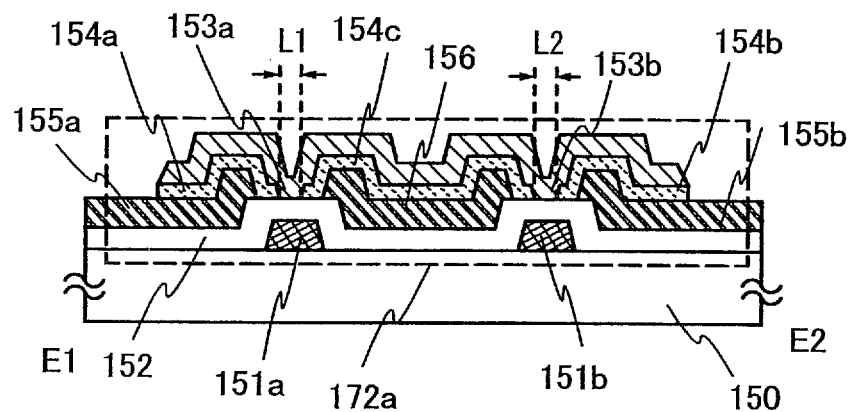

FIG. 4A is a plan view illustrating a thin film transistor 172a and FIG. 4B is a cross-sectional view of the thin film transistor 172a taken along line E1-E2 of FIG. 4A.

As illustrated in FIGS. 4A and 4B, the thin film transistor 172a having a multi-gate structure, which includes gate electrode layers 151a and 151b, a gate insulating layer 152, a source and drain electrode layers 155a and 155b, buffer layers 154a, 154b, and 154c, and channel formation regions 153a and 153b of a semiconductor layer, is formed over a substrate 150. Note that in the thin film transistor 172a having a multi-gate structure, a first channel length L1 corresponds to the distance between the buffer layers 154a and 154c, and a second channel length L2 corresponds to the distance between the buffer layers 154b and 154c.

The channel formation regions 153a and 153b of the semiconductor layer are oxide semiconductor layers containing In, Ga, and Zn, and the buffer layers 154a, 154b, and 154c are layers containing metal oxide having n-type conductivity. The buffer layers 154a and 154b serving as a source and drain regions have a higher carrier concentration than the channel formation regions 153a and 153b of the semiconductor layer.

The channel formation region 153a of the semiconductor layer is electrically connected to the channel formation region 153b of the semiconductor layer. In addition, the channel formation region 153a of the semiconductor layer is electrically connected to the source or drain electrode layer 155a with the buffer layer 154a interposed therebetween, and the channel formation region 153b of the semiconductor layer is electrically connected to the source or drain electrode layer 155b with the buffer layer 154b interposed therebetween.

Figure 5A:
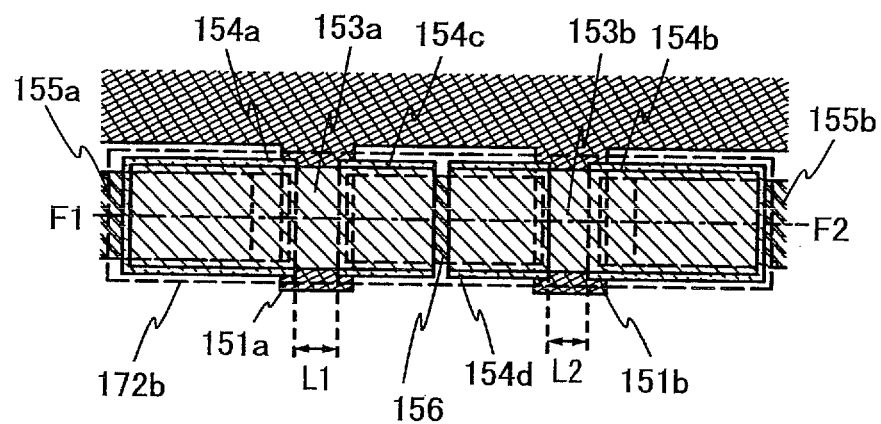
FIGS. 5A and 5B illustrate a semiconductor device according to one aspect of the present invention.
Figure 5B:
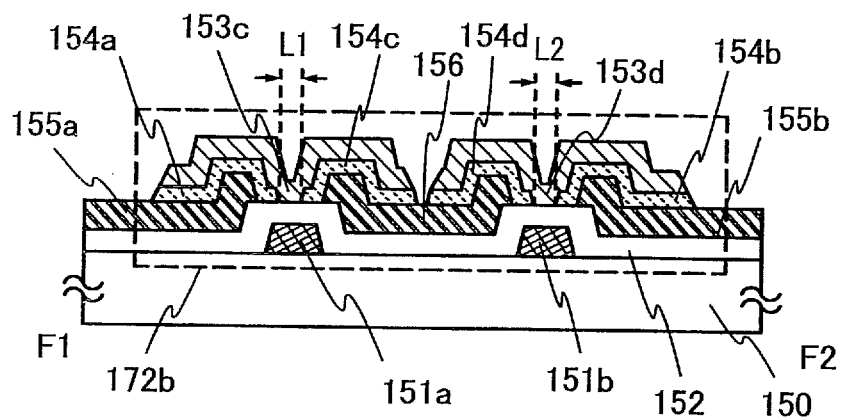

FIGS. 5A and 5B illustrate a thin film transistor 172b having another multi-gate structure. FIG. 5A is a plan view of the thin film transistor 172b and FIG. 5B is a cross-sectional view thereof taken along line F1-F2 of FIG. 5A. In the thin film transistor 172b of FIGS. 5A and 5B, a semiconductor layer is divided into plural parts. A wiring layer 156 which is formed in the same step as the source and drain electrode layers 155a and 155b is provided, and semiconductor layers 153c and 153d are electrically connected to each other through the wiring layer 156 with buffer layers 154c and 154d interposed therebetween.

Note that in the thin film transistor 172b having a multi-gate structure, a first channel length L1 corresponds to the distance between the buffer layers 154a and 154c, and a second channel length L2 corresponds to the distance between the buffer layers 154b and 154d.

As described above, in the thin film transistor having a multi-gate structure of one embodiment of the present invention, a semiconductor layer may be provided continuously over the gate electrode layers, or a plurality of semiconductor layers may be provided to be electrically connected to each other with the buffer layer, the wiring layer, or the like interposed therebetween.

The thin film transistor having a multi-gate structure of one embodiment of the present invention has small off current, and a semiconductor device including such a thin film transistor can have good electrical properties and high reliability.

In this embodiment, a double-gate structure including two gate electrode layers are described as an example of a multi-gate structure, but this embodiment can also be applied to a triple-gate structure or the like which has more gate electrode layers than the double gate structure.

This embodiment can be implemented in appropriate combination with the other embodiments.

(Embodiment 3)

In this embodiment, an example of a display device which is one example of a semiconductor device will be described. In the display device, at least a part of a driver circuit and a thin film transistor to be disposed in a pixel portion are formed over one substrate.

The thin film transistor to be disposed in the pixel portion is formed according to Embodiment 1 or 2. Further, the thin film transistor described in Embodiment 1 or 2 is an n-channel TFT, and thus a part of a driver circuit that can include an n-channel TFT among driver circuits is formed over the same substrate as the thin film transistor of the pixel portion.

Figure 6A:
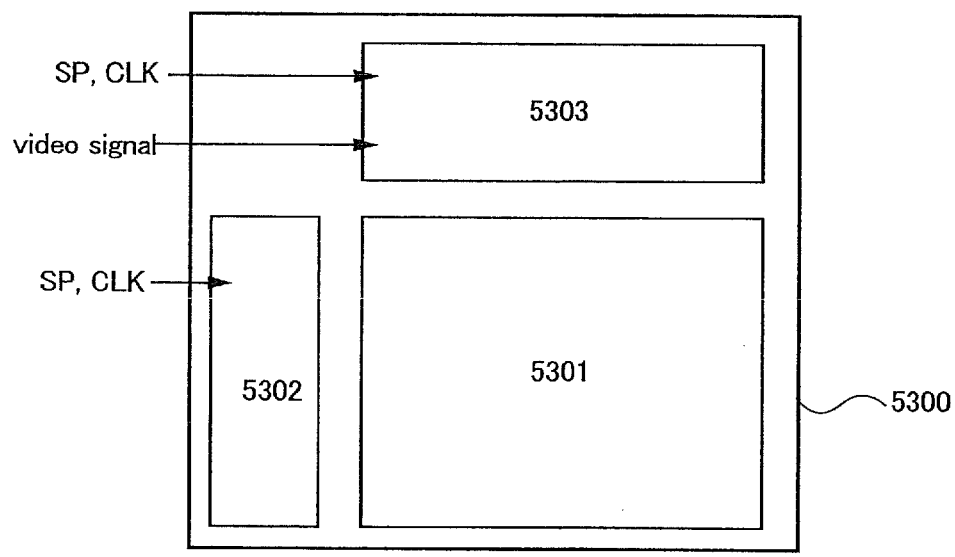
FIGS. 6A and 6B are block diagrams of semiconductor devices according to one aspect of the present invention.

FIG. 6A illustrates an example of a block diagram of an active-matrix liquid crystal display device which is an example of the present invention. The display device illustrated in FIG. 6A includes, over a substrate 5300, a pixel portion 5301 including a plurality of pixels that are provided with a display element; a scan line driver circuit 5302 that selects a pixel; and a signal line driver circuit 5303 that controls a video signal input to the selected pixel.

The pixel portion 5301 is connected to the signal line driver circuit 5303 by a plurality of signal lines S1 to Sm (not illustrated) that extend in a column direction from the signal line driver circuit 5303, and to the scan line driver circuit 5302 by a plurality of scan lines G1 to Gn (not illustrated) that extend in a row direction from the scan line driver circuit 5302. The pixel portion 5301 includes a plurality of pixels (not illustrated) arranged in matrix so as to correspond to the signal lines S1 to Sm and the scan lines G1 to Gn. Each pixel is connected to a signal line Sj (one of the signal lines S1 to Sm) and a scan line Gj (one of the scan lines G1 to Gn).

In addition, the thin film transistor described in any one of Embodiment 1 or 2 is an n-channel TFT, and a signal line driver circuit including the n-channel TFT will be described with reference to FIG. 7.

Figure 7:
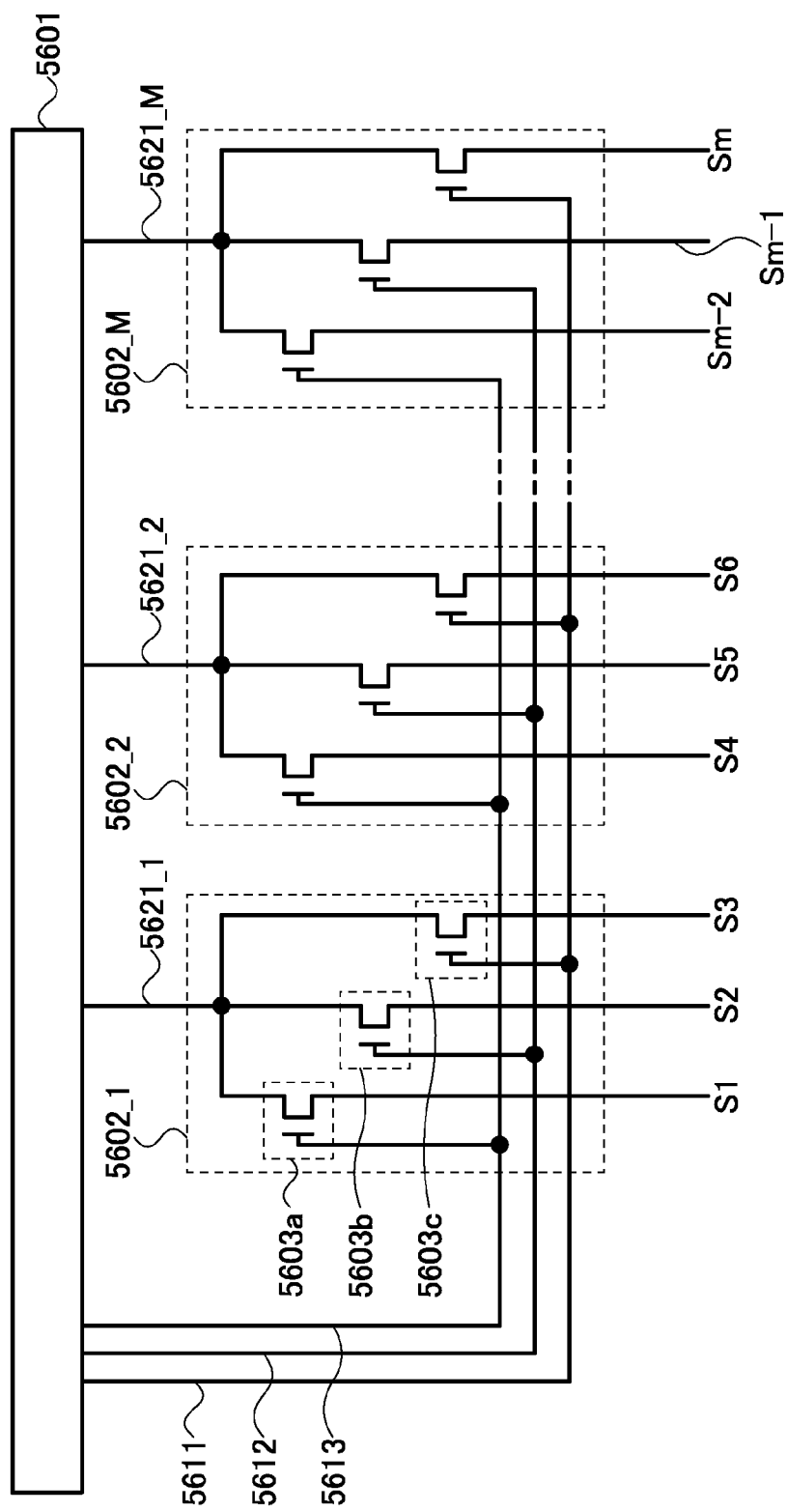
FIG. 7 illustrates an example of a structure of a signal line driver circuit.

The signal line driver circuit illustrated in FIG. 7 includes a driver IC 5601, switch groups 5602-1 to 5602-M, a first wiring 5611, a second wiring 5612, a third wiring 5613, and wirings 5621-1 to 5621-M. Each of the switch groups 5602-1 to 5602-M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621-1 to 5621-M. Each of the switch groups 5602-1 to 5602-M is connected to the first wiring 5611, the second wiring 5612, and the third wiring 5613, and the switch groups 5602-1 to 5602-M are connected to the wirings 5621-1 to 5621-M, respectively. Each of the wirings 5621-1 to 5621-M is connected to three signal lines via the first thin film transistor 5603a, the second thin film transistor 5603b, and the third thin film transistor 5603c. For example, the wiring 5621-J of the J-th column (one of the wirings 5621-1 to 5621-M) is connected to a signal line Sj−1, a signal line Sj, and a signal line Sj+1 via the first thin film transistor 5603a, the second thin film transistor 5603b, and the third thin film transistor 5603c which are included in the switch group 5602-J.

A signal is input to each of the first wiring 5611, the second wiring 5612, and the third wiring 5613.

Note that the driver IC 5601 is preferably formed over a single crystal substrate. The switch groups 5602-1 to 5602-M are preferably formed over the same substrate as the pixel portion. Therefore, the driver IC 5601 and the switch groups 5602-1 to 5602-M are preferably connected through an FPC or the like.

Figure 8:
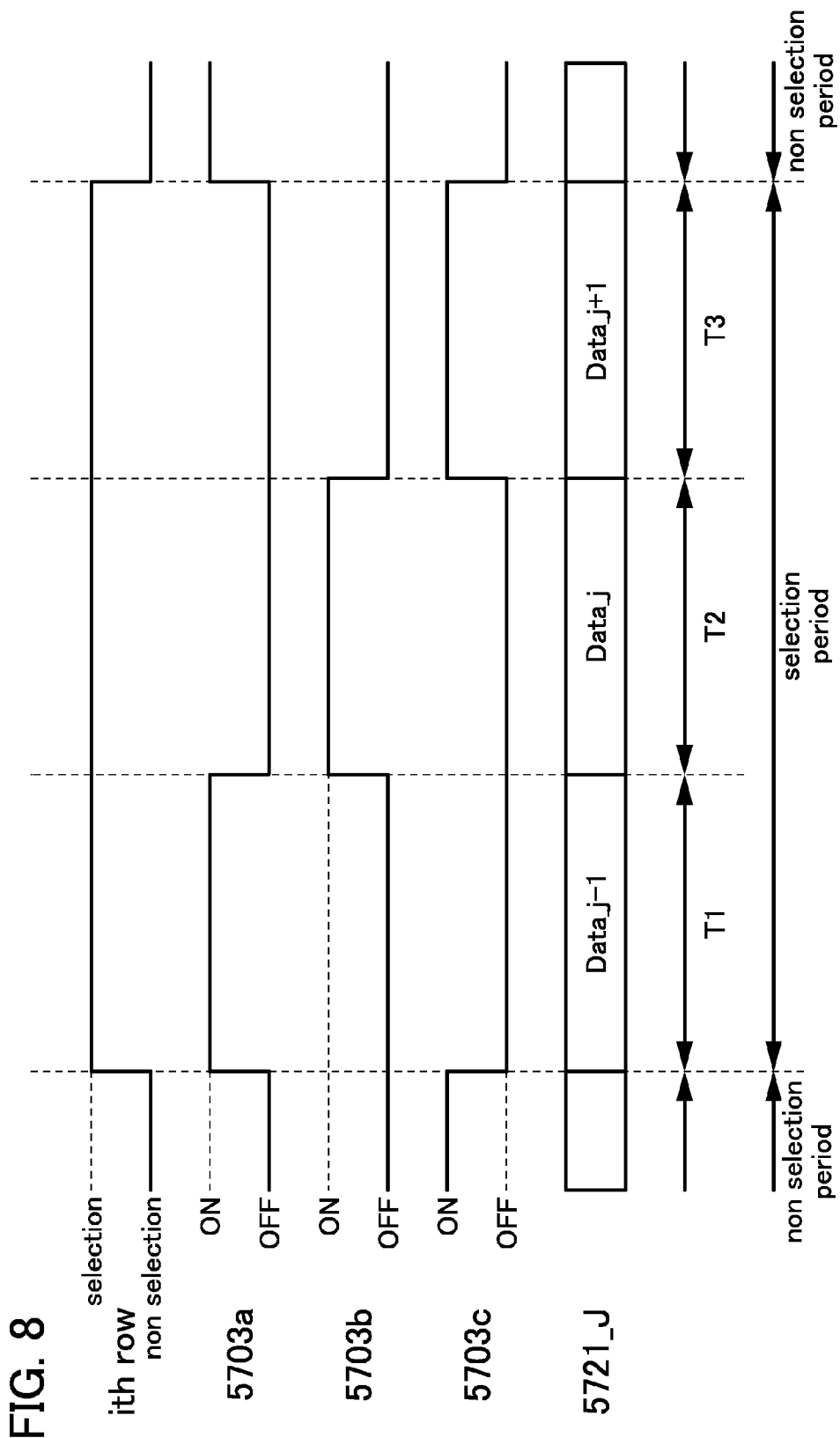
FIG. 8 is a timing chart illustrating an example of operation of a signal line driver circuit.

Next, operation of the signal line driver circuit illustrated in FIG. 7 will be described with reference to a timing chart in FIG. 8. The timing chart in FIG. 8 illustrates a case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 7 operates in a similar manner to that of FIG. 8 even when a scan line of another row is selected.

Note that the timing chart in FIG. 8 shows a case where the wiring 56214 of the J-th column is connected to the signal line Sj−1, the signal line Sj, and the signal line Sj+1 via the first thin film transistor 5603a, the second thin film transistor 5603b, and the third thin film transistor 5603c.

The timing chart in FIG. 8 shows timing at which the scan line Gi of the i-th row is selected, timing 5703a at which the first thin film transistor 5603a is turned on/off, timing 5703b at which the second thin film transistor 5603b is turned on/off, timing 5703c at which the third thin film transistor 5603c is turned on/off, and a signal 57214 input to the wiring 56214 of the J-th column.

In the first sub-selection period T1, the second sub-selection period T2, and the third sub-selection period T3, different video signals are input to the wirings 5621-1 to 5621-M. For example, a video signal input to the wiring 56214 in the first sub-selection period T1 is input to the signal line Sj−1, a video signal input to the wiring 56214 in the second sub-selection period T2 is input to the signal line Sj, and a video signal input to the wiring 5621-J in the third sub-selection period T3 is input to the signal line Sj+1. The video signals input to the wiring 5621-J in the first sub-selection period T1, the second sub-selection period T2, and the third sub-selection period T3 are denoted by Data-j−1, Data-j, and Data j+1, respectively.

As illustrated in FIG. 8, in the first sub-selection period T1, the first thin film transistor 5603a is turned on, and the second thin film transistor 5603b and the third thin film transistor 5603c are turned off. At this time, Data-j−1 input to the wiring 56214 is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data-j input to the wiring 56214 is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data j+1 input to the wiring 56214 is input to the signal line Sj+1 via the third thin film transistor 5603c.

As described above, in the signal line driver circuit in FIG. 7, by dividing one gate selection period into three, video signals can be input to three signal lines from one wiring 5621 in one gate selection period. Therefore, in the signal line driver circuit in FIG. 7, the number of connections between the substrate provided with the driver IC 5601 and the substrate provided with the pixel portion can be approximately ⅓ of the number of signal lines. The number of connections is reduced to approximately ⅓ of the number of signal lines, so that reliability, yield, etc., of the signal line driver circuit in FIG. 7 can be improved.

Note that there are no particular limitations on the arrangement, the number, a driving method, and the like of the thin film transistors, as long as one gate selection period is divided into a plurality of sub-selection periods and video signals are input to a plurality of signal lines from one wiring in the respective sub-selection periods as illustrated in FIG. 7.

For example, when video signals are input to three or more signal lines from one wiring in three or more sub-selection periods, it is only necessary to add a thin film transistor and a wiring for controlling the thin film transistor. Note that when one gate selection period is divided into four or more sub-selection periods, one sub-selection period becomes shorter. Therefore, one gate selection period is preferably divided into two or three sub-selection periods.

Figure 9:
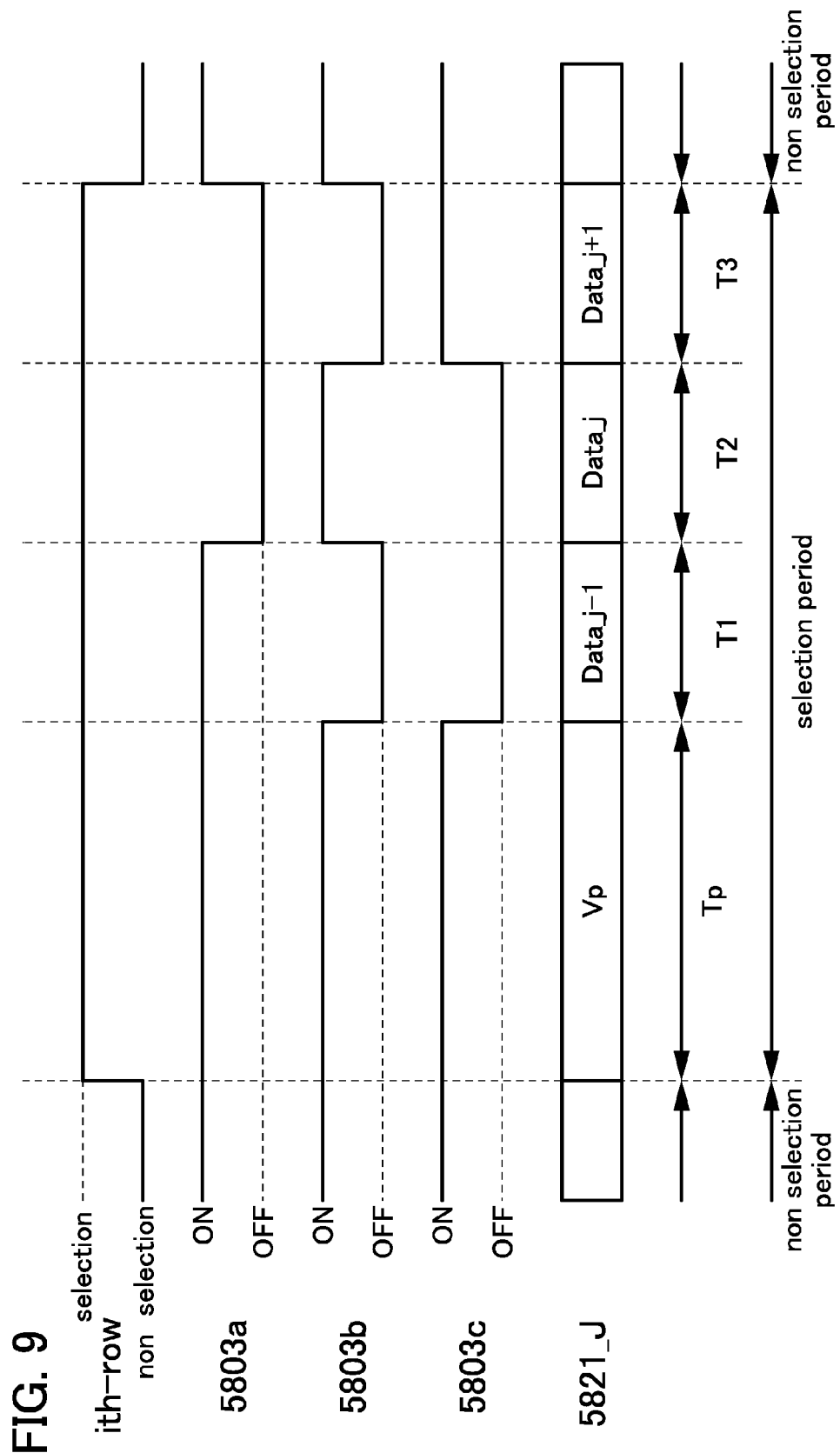
FIG. 9 is a timing chart illustrating an example of operation of a signal line driver circuit.

As another example, one selection period may be divided into a precharge period Tp, the first sub-selection period T1, the second sub-selection period T2, and the third sub-selection period T3 as illustrated in a timing chart in FIG. 9. The timing chart in FIG. 9 illustrates timing at which the scan line Gi of the i-th row is selected, timing 5803a at which the first thin film transistor 5603a is turned on/off, timing 5803b at which the second thin film transistor 5603b is turned on/off, timing 5803c at which the third thin film transistor 5603c is turned on/off, and a signal 58214 input to the wiring 5621-J of the J-th column. As illustrated in FIG. 9, the first thin film transistor 5603a, the second thin film transistor 5603b, and the third thin film transistor 5603c are tuned on in the precharge period Tp. At this time, precharge voltage Vp input to the wiring 5621-J is input to each of the signal line Sj−1, the signal line Sj, and the signal line Sj+1 via the first thin film transistor 5603a, the second thin film transistor 5603b, and the third thin film transistor 5603c. In the first sub-selection period T1, the first thin film transistor 5603a is turned on, and the second thin film transistor 5603b and the third thin film transistor 5603c are turned off. At this time, Data-j−1 input to the wiring 5621-J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data-j input to the wiring 5621-J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data j+1 input to the wiring 5621-J is input to the signal line Sj+1 via the third thin film transistor 5603c.

As described above, in the signal line driver circuit in FIG. 7 to which the timing chart in FIG. 9 is applied, the video signal can be written to the pixel at high speed because the signal line can be precharged by providing a precharge period before a sub-selection period. Note that portions in FIG. 9 which are similar to those of FIG. 8 are denoted by common reference numerals and detailed description of the portions which are the same and portions which have similar functions is omitted.

Further, a structure of a scan line driver circuit is described. The scan line driver circuit includes a shift register and a buffer. Additionally, the scan line driver circuit may include a level shifter in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Further, since the transistors in the pixels of one line have to be turned on at the same time, a buffer which supplies a large current is used.

One mode of a shift register which is used for a part of a scan line driver circuit will be described with reference to FIG. 10 and FIG. 11.

Figure 10:
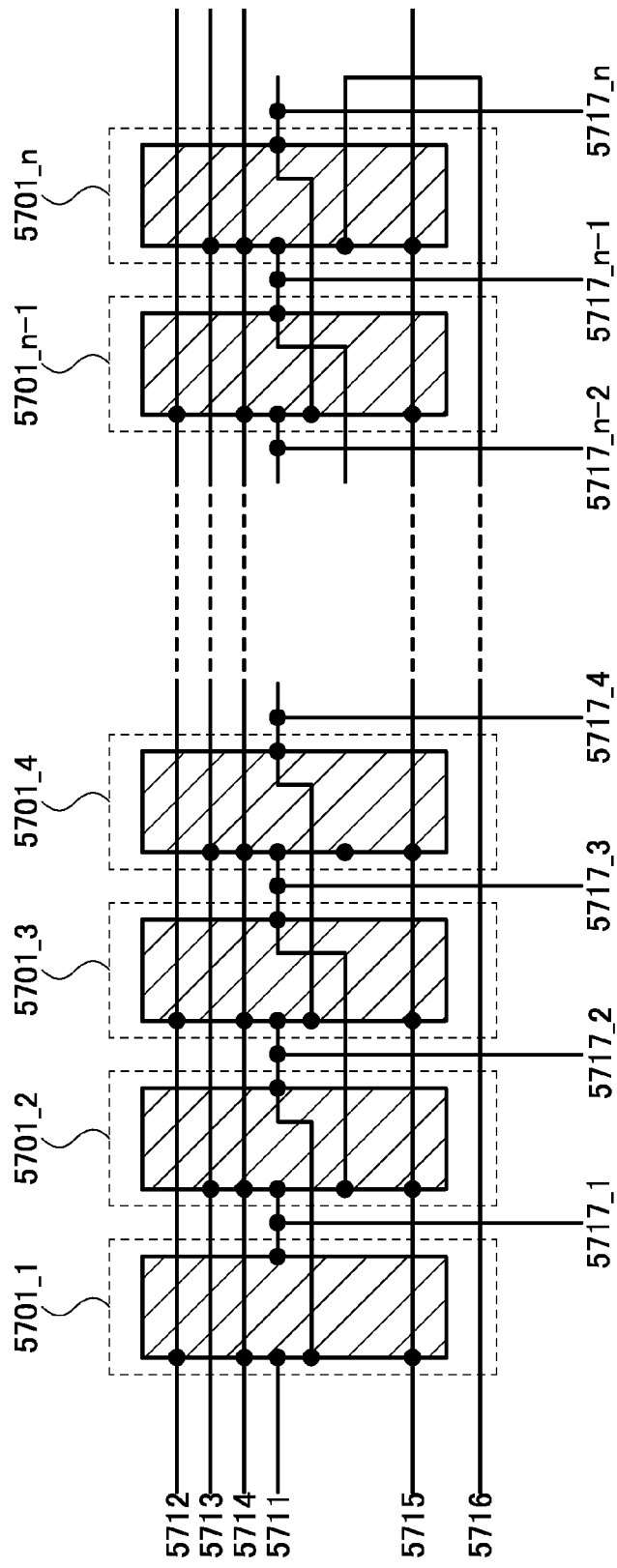
FIG. 10 illustrates an example of a structure of a shift register.

FIG. 10 illustrates a circuit configuration of the shift register. The shift register illustrated in FIG. 10 includes a plurality of flip-flops 5701-i (one of flip-flops 5701-1 to 5701-n). The shift register is operated with input of a first clock signal, a second clock signal, a start pulse signal, and a reset signal.

Connection relations of the shift register in FIG. 10 will be described. In the i-th stage flip-flop 5701-i (one of the flip-flops 5701-1 to 5701-n) in the shift register of FIG. 10, a first wiring 5501 illustrated in FIG. 11 is connected to a seventh wiring 5717-i−1; a second wiring 5502 illustrated in FIG. 11 is connected to a seventh wiring 5717-i+1; a third wiring 5503 illustrated in FIG. 11 is connected to a seventh wiring 5717-i; and a sixth wiring 5506 illustrated in FIG. 11 is connected to a fifth wiring 5715.

Figure 11:
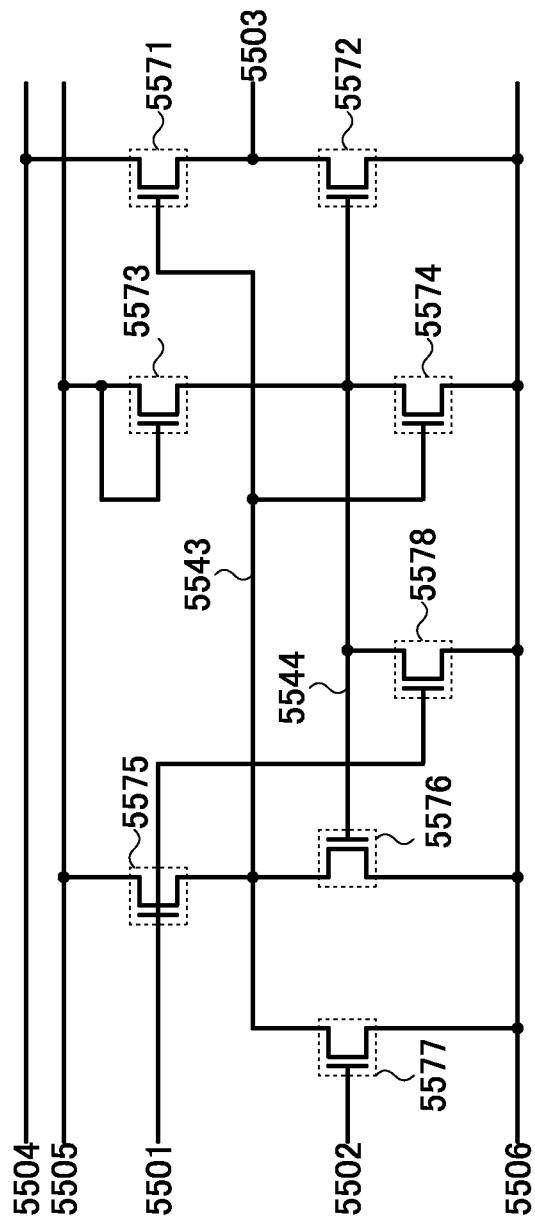
FIG. 11 illustrates an example of a connecting structure of flip-flops illustrated in FIG. 10.

Further, a fourth wiring 5504 illustrated in FIG. 11 is connected to a second wiring 5712 in flip-flops of odd-numbered stages, and is connected to a third wiring 5713 in flip-flops of even-numbered stages. A fifth wiring 5505 illustrated in FIG. 11 is connected to a fourth wiring 5714.

Note that the first wiring 5501 of the first stage flip-flop 5701-1 illustrated in FIG. 11 is connected to a first wiring 5711. Moreover, the second wiring 5502 of the n-th stage flip-flop 5701-n illustrated in FIG. 11 is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Next, FIG. 11 illustrates details of the flip-flop illustrated in FIG. 10. A flip-flop illustrated in FIG. 11 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

Next, connection structures of the flip-flop illustrated in FIG. 11 will be described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505 and a second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to a gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the points at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In addition, the signal line driver circuit and the scan line driver circuit can be formed using only the n-channel TFTs described in Embodiment 1 or 2. The n-channel TFT described in Embodiment 1 or 2 has a high mobility, and thus a driving frequency of a driver circuit can be increased. In addition, in the n-channel TFT described in Embodiment 1 or 2, since parasitic capacitance is reduced by the buffer layer containing a metal oxide having n-type conductivity, the frequency characteristics (referred to as f characteristics) are high. For example, a scan line driver circuit using the n-channel TFT described in any one of Embodiments 1 or 2 can operate at high speed, and thus a frame frequency can be increased and insertion of black images can be realized.

In addition, when the channel width of the transistor in the scan line driver circuit is increased or a plurality of scan line driver circuits are provided, for example, higher frame frequency can be realized. When a plurality of scan line driver circuits are provided, a scan line driver circuit for driving even-numbered scan lines is provided on one side and a scan line driver circuit for driving odd-numbered scan lines is provided on the opposite side; thus, increase in frame frequency can be realized.

Figure 6B:
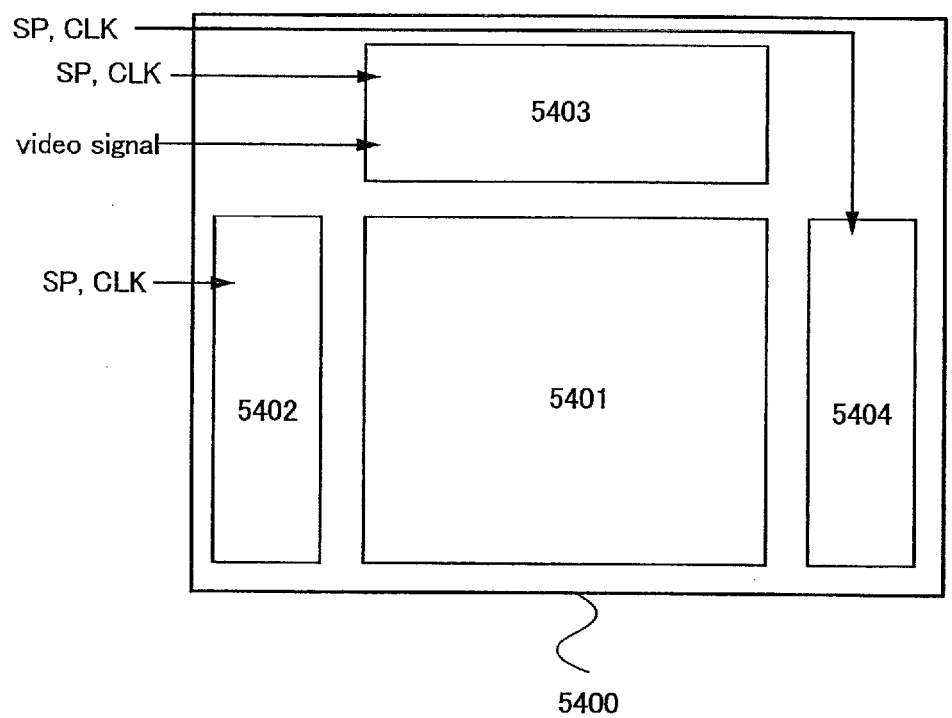

Further, when an active-matrix light-emitting display device which is an example of the present invention is manufactured, a plurality of thin film transistors are arranged in at least one pixel, and thus a plurality of scan line driver circuits are preferably arranged. FIG. 6B is a block diagram illustrating an example of an active-matrix light-emitting display device.

The light-emitting display device illustrated in FIG. 6B includes, over a substrate 5400, a pixel portion 5401 having a plurality of pixels provided with a display element, a first scan line driver circuit 5402 and a second scan line driver circuit 5404 that select a pixel, and a signal line driver circuit 5403 that controls input of a video signal to the selected pixel.

When the video signal input to a pixel of the light-emitting display device illustrated in FIG. 6B is a digital signal, a pixel emits light or does not emit light by switching of ON/Off of a transistor. Thus, grayscale can be displayed using an area ratio grayscale method or a time ratio grayscale method. An area ratio grayscale method refers to a driving method by which one pixel is divided into a plurality of subpixels and the respective subpixels are driven independently based on video signals so that grayscale is displayed. Further, a time ratio grayscale method refers to a driving method by which a period during which a pixel is in a light-emitting state is controlled so that grayscale is displayed.

Since the response speed of light-emitting elements is higher than that of liquid crystal elements or the like, the light-emitting elements are more suitable for a time ratio grayscale method than the liquid-crystal display elements. Specifically, in the case of displaying with a time gray scale method, one frame period is divided into a plurality of subframe periods. Then, in accordance with video signals, the light-emitting element in the pixel is set in a light-emitting state or a non-light-emitting state in each subframe period. By dividing one frame into a plurality of subframes, the total length of time, in which pixels actually emit light in one frame period, can be controlled with video signals so that gray scales are displayed.

In the example of the light-emitting display device illustrated in FIG. 6B, in a case where two TFTs of a switching TFT and a current control TFT are arranged in one pixel, the first scan line driver circuit 5402 generates a signal which is input to a first scan line serving as a gate wiring of the switching TFT, and the second scan line driver circuit 5404 generates a signal which is input to a second scan line serving as a gate wiring of the current control TFT; however, one scan line driver circuit may generate both the signal which is input to the first scan line and the signal which is input to the second scan line. In addition, for example, there is a possibility that a plurality of the first scan lines used for controlling the operation of the switching element are provided in each pixel, depending on the number of transistors included in the switching element. In that case, one scan line driver circuit may generate all signals that are input to the plurality of first scan lines, or a plurality of scan line driver circuits may generate signals that are input to the plurality of first scan lines.

In addition, also in the light-emitting display device, a part of a driver circuit that can include n-channel TFTs among driver circuits can be formed over the same substrate as the thin film transistors of the pixel portion. Alternatively, the signal line driver circuit and the scan line driver circuit can be formed using only the n-channel TFTs described in Embodiment 1 or 2.

Moreover, the above driver circuit can be used for an electronic paper that drives electronic ink using an element electrically connected to a switching element, without being limited to applications to a liquid crystal display device or a light-emitting display device. The electronic paper is also referred to as an electrophoretic display device (electrophoretic display) and has advantages in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positive-charged and second particles which are negative-charged. By applying an electric field to the microcapsules, the particles in the microcapsules are moved in opposite directions to each other and only the color of the particles concentrated on one side is exhibited. Note that the first particles and the second particles each contain pigment and do not move without an electric field. Moreover, the colors of the first particles and the second particles are different from each other (the colors include colorless or achroma).

In this way, an electrophoretic display is a display that utilizes a so-called dielectrophoretic effect by which a substance that has a high dielectric constant moves to a high-electric field region. An electrophoretic display does not need to use a polarizer or a counter substrate, which are required in a liquid crystal display device; therefore, both the thickness and weight of the electrophoretic display device can be a half of those of a liquid crystal display device.

A solution in which the above microcapsules are dispersed throughout a solvent is referred to as electronic ink. This electronic ink can be printed on a surface of glass, plastic, cloth, paper, or the like. Furthermore, by use of a color filter or particles that have a pigment, color display is possible, as well.

In addition, if a plurality of the above microcapsules are arranged as appropriate over an active-matrix substrate so as to be interposed between two electrodes, an active-matrix display device can be completed, and display can be performed by application of an electric field to the microcapsules. For example, the active matrix substrate obtained by the thin film transistors described in Embodiment 1 or 2 can be used.

It is to be noted that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, or a magnetophoretic material or formed of a composite material of any of these.

Through the above steps, a highly reliable display device as a semiconductor device can be manufactured.

This embodiment can be implemented in combination with the structure described in Embodiments 1 or 2 as appropriate.

(Embodiment 4)

As an embodiment of the present invention, thin film transistors are manufactured, and a semiconductor device having a display function (also referred to as a display device) can be manufactured using the thin film transistors for a pixel portion and further for a driver circuit. Further, when part or whole of a driver circuit using a thin film transistors are formed over the same substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Further, a display medium whose contrast is changed by an electric effect, such as an electronic ink, can be used.

In addition, the display device includes a panel in which the display element is sealed, and a module in which an IC or the like including a controller is mounted on the panel. An embodiment of the present invention also relates to an element substrate before the display element is completed in a manufacturing process of the display device, and the element substrate is provided with means for supplying current or voltage to the display element in each of a plurality of pixels. Specifically, the element substrate may be in a state after only a pixel electrode of the display element is formed, a state after a conductive film to be a pixel electrode is formed and before the conductive film is etched to form the pixel electrode, or any of other states.

Note that a display device in this specification means an image display device, a display device, or a light source (including a lighting device). Further, the display device also includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element by chip on glass (COG).

In this embodiment, a liquid crystal display device will be described as one embodiment of the present invention.

Figure 12A:
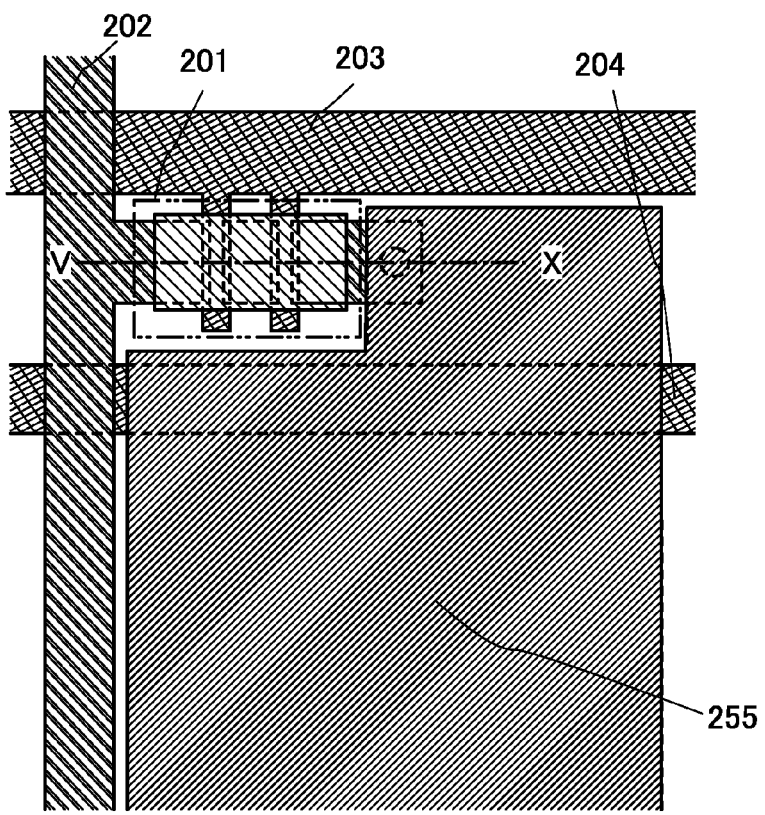
FIGS. 12A and 12B illustrate a semiconductor device according to one aspect of the present invention.
Figure 12B:
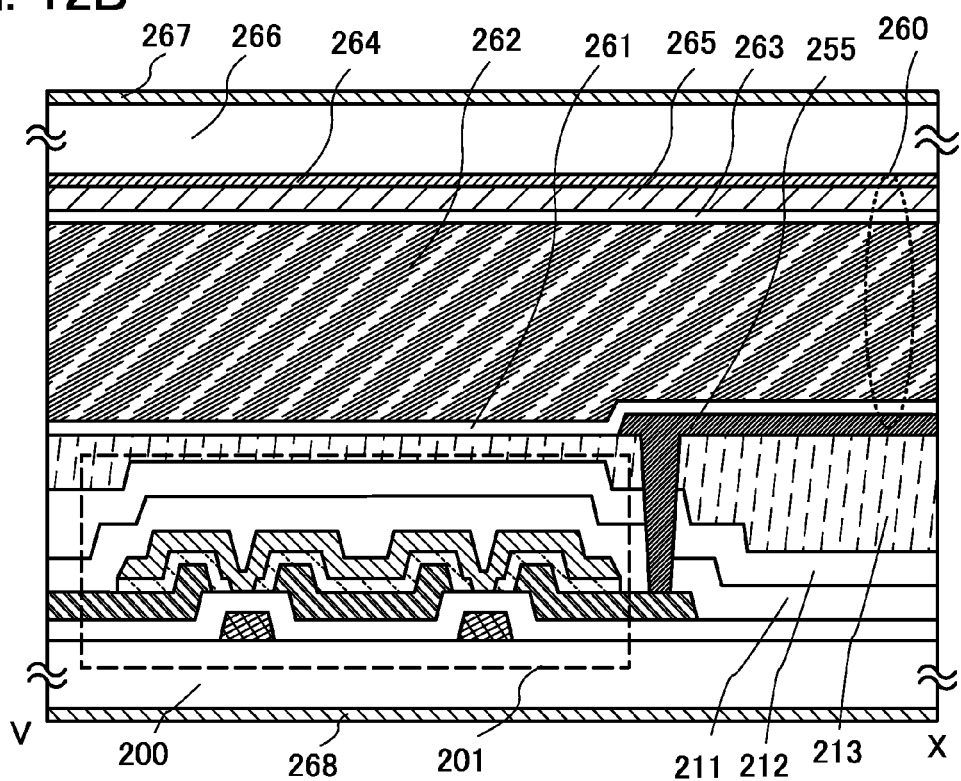

FIGS. 12A and 12B illustrate an active matrix liquid crystal display device to which the present invention is applied. FIG. 12A is a plan view of the liquid crystal display device. FIG. 12B is a cross-sectional view taken along line V-X of FIG. 12A. Note that FIG. 12A is a plan view of a thin film transistor 201 and an electrode layer 255 which are formed over a substrate 200. The thin film transistor 201 used in the semiconductor device can be manufactured in a manner similar to the thin film transistor described in Embodiment 2 and is a highly reliable thin film transistor including an IGZO semiconductor layer and a buffer layer containing metal oxide having n-type conductivity. Alternatively, the thin film transistor described in Embodiment 1 can be used as the thin film transistor 201 of this embodiment.

The liquid crystal display device which is an example of this embodiment illustrated in FIG. 12A includes a source wiring layer 202, an inverted-staggered thin film transistor 201 with a multi-gate structure, a gate wiring layer 203, and a capacitor wiring layer 204.

Further, in FIG. 12B, the liquid crystal display device of this embodiment includes a liquid crystal display element 260 in which the substrate 200 and a substrate 266 face each other with a liquid crystal layer 262 interposed therebetween. The substrate 200 is provided with the thin film transistor 201 with a multi-gate structure, an insulating layer 211, an insulating layer 212, an insulating layer 213, an electrode layer 255 used for a display element, an insulating layer 261 serving as an alignment film, and a polarizing plate 268. The substrate 266 is provided with an insulating layer 263 serving as an alignment film, an electrode layer 265 used for a display element, a coloring layer 264 serving as a color filter, and a polarizing plate 267.

Alternatively, liquid crystal showing a blue phase for which an alignment film is unnecessary may be used. A blue phase is one of the liquid crystal phases, which is generated just before a cholesteric phase changes into an isotropic phase while temperature of cholesteric liquid crystal is increased. Since the blue phase is only generated within a narrow range of temperature, a liquid crystal composition containing a chiral agent at 5 wt % or more is used for the liquid crystal layer 262 in order to improve the temperature range. The liquid crystal composition which includes liquid crystal showing a blue phase and a chiral agent has a small response time of 10 µs to 100 µs, has optical isotropy, which makes the alignment process unneeded, and has a small viewing angle dependence.

Although FIGS. 12A and 12B illustrate an example of a transmissive liquid crystal display device, this embodiment can also be applied to a reflective liquid crystal display device and a transflective liquid crystal display device.

FIGS. 12A and 12B illustrate an example of the liquid crystal display device in which the polarizing plate 267 is provided on the outer surface of the substrate 266 (on the viewer side) and the coloring layer 264 and the electrode layer 265 used for a display element are provided on the inner surface of the substrate 266 in that order; however, the polarizing plate 267 may be provided on the inner surface of the substrate 266. The stacked structure of the polarizing plate and the coloring layer is not limited to that illustrated in FIG. 12B and may be set as appropriate depending on materials of the polarizing plate and the coloring layer or conditions of manufacturing steps. Further, a light-blocking film serving as a black matrix may be provided.

In this embodiment, in order to reduce the surface roughness of the thin film transistor and to improve the reliability of the thin film transistor, the thin film transistor obtained by Embodiment 2 is covered with the insulating layers (the insulating layer 211, the insulating layer 212, and the insulating layer 213) serving as a protective film or a planarizing insulating film. Note that the protective film is provided to prevent entry of impurities floating in the air, such as an organic substance, a metal substance, or moisture, and is preferably a dense film. The protective film may be formed by a CVD method, a sputtering method, or the like to be a single-layer film or a multi-layer film of a silicon oxide film, a silicon nitride film, a silicon oxynitride film, and/or a silicon nitride oxide film. Alternatively, as the protective film, a silicon oxide film may be formed by a plasma CVD method using a process gas containing an organosilane gas and oxygen.

As examples of organosilane, the following compounds can be given: tetraethoxysilane (TEOS, chemical formula: $Si(OC_2H_5)_4$), tetramethylsilane (TMS, chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), and trisdimethylaminosilane ($SiH(N(CH_3)_2)_3$).

As a first layer of the protective film, the insulating layer 211 is formed. The insulating layer 211 has an effect of preventing a hillock of an aluminum film. Here, as the insulating layer 211, a silicon oxide film is formed by a plasma CVD method. For a process gas for forming the silicon oxide film, TEOS and $O_2$ are used. The flow ratio is TEOS/$O_2$=15/750. The substrate temperature in the formation step is 300° C.

As a second layer of the protective film, the insulating layer 212 is formed. Here, as the insulating layer 212, a silicon nitride film is formed by a plasma CVD method. For a process gas for forming the silicon nitride film, $SiH_4$, $N_2$, $NH_3$, and $H_2$ are used. The use of the silicon nitride film as one layer of the protective film can prevent mobile ions such as sodium ions from entering a semiconductor region, thereby suppressing change in electrical properties of the TFT.

After the protective film is formed, the IGZO semiconductor layer may be annealed (at 300° C. to 400° C.).

The insulating layer 213 is formed as the planarizing insulating film. For the insulating layer 213, an organic material having heat resistance, such as polyimide, acrylic, polyimide, benzocyclobutene, polyamide, or epoxy, can be used. Other than such organic materials, it is also possible to use a low-dielectric constant material (a low-k material), a siloxane-based resin, phosphosilicate glass (PSG), borophosphosilicate glass (BPSG), or the like. A siloxane-based resin may include as a substituent at least one of fluorine, an alkyl group, and an aryl group, as well as hydrogen. Note that the insulating layer 213 may be formed by stacking a plurality of insulating films formed from these materials.

Note that a siloxane-based resin is a resin formed from a siloxane material as a starting material and having the bond of Si—O—Si. The siloxane-based resin may include as a substituent at least one of fluorine, an alkyl group, and aromatic hydrocarbon, as well as hydrogen.

The insulating layer 213 can be formed, depending on the material, by a CVD method, a sputtering method, an SOG method, spin coating, dipping, spray coating, a droplet discharging method (e.g., an ink jet method, screen printing, or offset printing), doctor knife, roll coater, curtain coater, knife coater, or the like. In the case where the insulating layer 213 is formed using a material solution, the IGZO semiconductor layer may be annealed (300° C. to 400° C.) at the same time of a baking step. The baking step of the insulating layer 213 also serves as the annealing step of the IGZO semiconductor layer, whereby a semiconductor device can be manufactured efficiently.

The electrode layers 255 and 265 each serving as a pixel electrode layer can be made of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can be used for the electrode layers 255 and 265. The pixel electrode made of the conductive composition preferably has a sheet resistance of 10000 ohms per square or less and a transmittance of 70% or more at a wavelength of 550 nm. Further, the resistivity of the conductive high molecule contained in the conductive composition is preferably 0.1 Ω·cm or less.

As the conductive high molecule, a so-called π-electron conjugated conductive polymer can be used. For example, it is possible to use polyaniline or a derivative thereof, polypyrrole or a derivative thereof, polythiophene or a derivative thereof, or a copolymer of two or more of them.

Through the above process, a highly reliable liquid crystal display device as a semiconductor device can be manufactured.

This embodiment can be implemented in combination with the structure described in any of Embodiments 1 to 3 as appropriate.

(Embodiment 5)

In this embodiment, an electronic paper will be described as an example of a semiconductor device.

Figure 13:
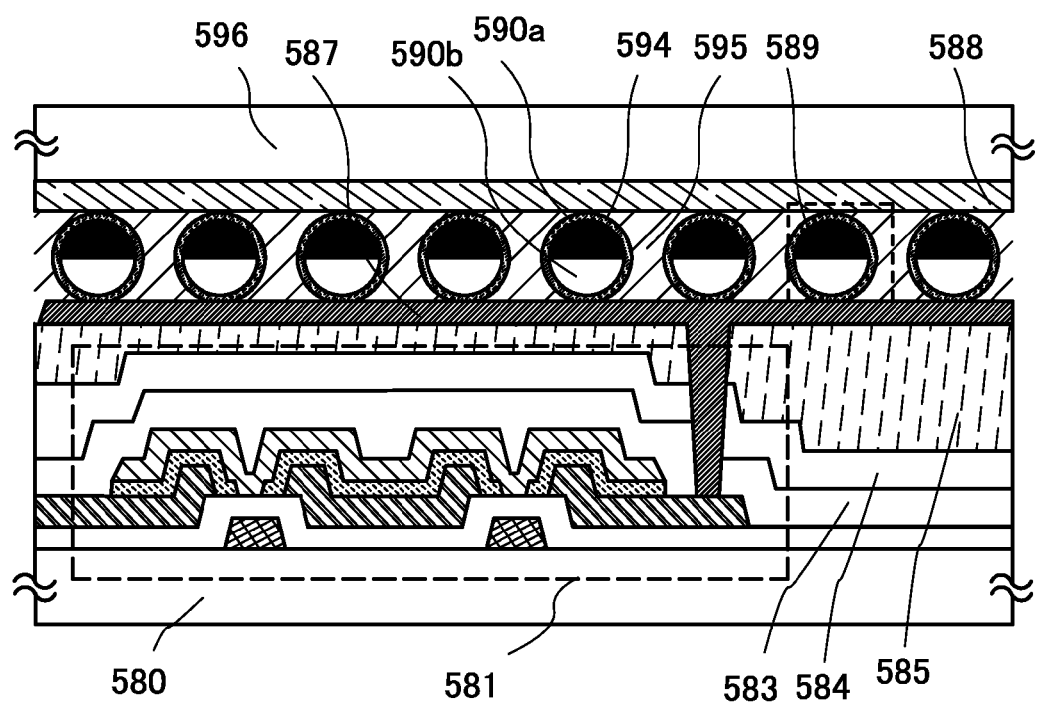
FIG. 13 illustrates a semiconductor device according to one aspect of the present invention.

FIG. 13 illustrates an active matrix electronic paper as one mode of the present invention. A thin film transistor 581 used for the semiconductor device can be manufactured in a manner similar to the thin film transistor described in Embodiment 2 and is a highly reliable thin film transistor including an IGZO semiconductor layer and a buffer layer containing metal oxide having n-type conductivity. The thin film transistor described in Embodiment 1 can also be used as the thin film transistor 581 of this embodiment.

The electronic paper in FIG. 13 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control the orientation of the spherical particles, so that display is performed.

The thin film transistor 581 is an inverted-staggered thin film transistor with a multi-gate structure, and a source electrode layer or a drain electrode layer is in contact with a first electrode layer 587 through an opening formed in an insulating layer 585, whereby the thin film transistor 581 is electrically connected to the first electrode layer 587. Between the first electrode layer 587 and a second electrode layer 588, spherical particles 589 each having a black region 590a, a white region 590b, and a cavity 594 around the regions which is filled with liquid are provided. A space around the spherical particles 589 is filled with a filler 595 such as a resin (see FIG. 13).

Further, instead of the twisting ball, an electrophoretic element can also be used. A microcapsule having a diameter of about 10 µm to 200 µm in which transparent liquid, positively-charged white microparticles, and negatively-charged black microparticles are encapsulated, is used. In the microcapsule which is provided between the first electrode layer and the second electrode layer, when an electric field is applied between the first electrode layer and the second electrode layer, the white microparticles and the black microparticles move to opposite sides from each other, so that white or black can be displayed. A display element using this principle is an electrophoretic display element and is generally called an electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through the above process, a highly reliable electronic paper as a semiconductor device can be manufactured.

This embodiment can be implemented in appropriate combination with the structures described in any of Embodiments 1 to 3.

(Embodiment 6)

In this embodiment, an example of a light-emitting display device will be described as an example of a semiconductor device. As a display element included in a display device, a light-emitting element utilizing electroluminescence is described here. Light-emitting elements utilizing electroluminescence are classified according to whether the light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) are recombined, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 14A:
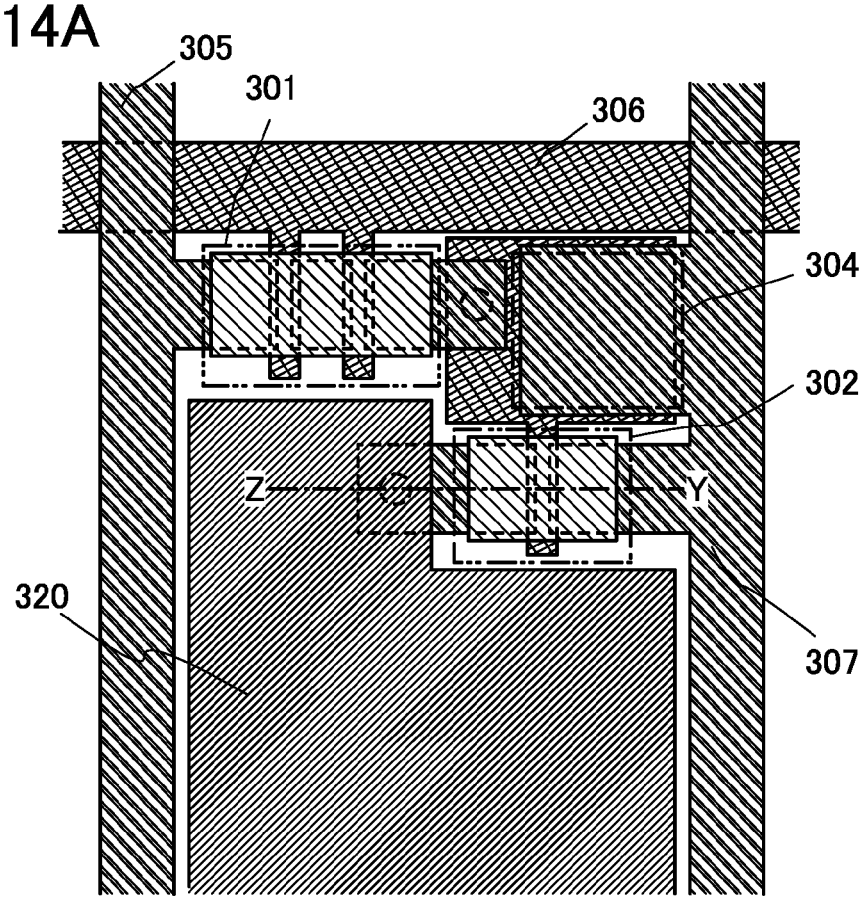
FIGS. 14A and 14B illustrate a semiconductor device according to one aspect of the present invention.
Figure 14B:
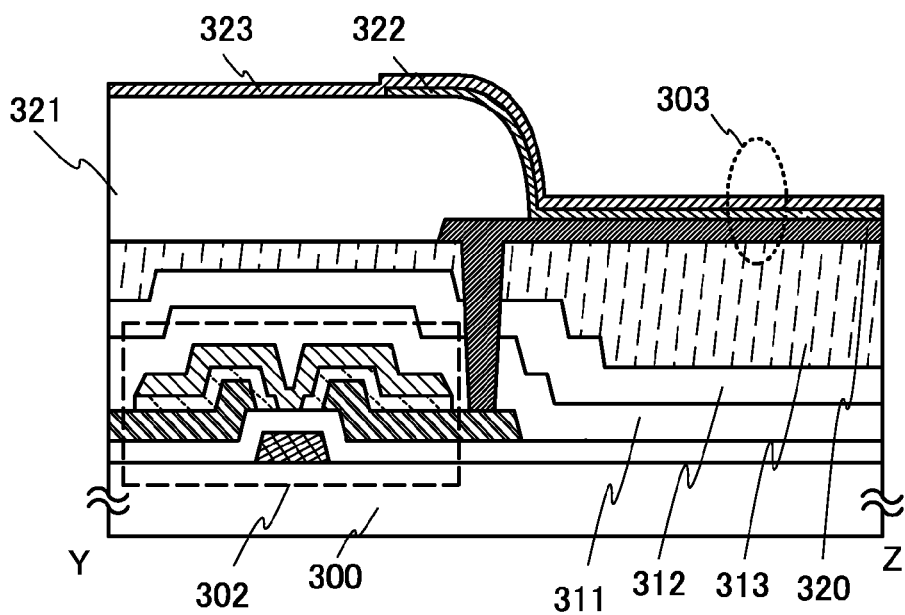
Figure 15:
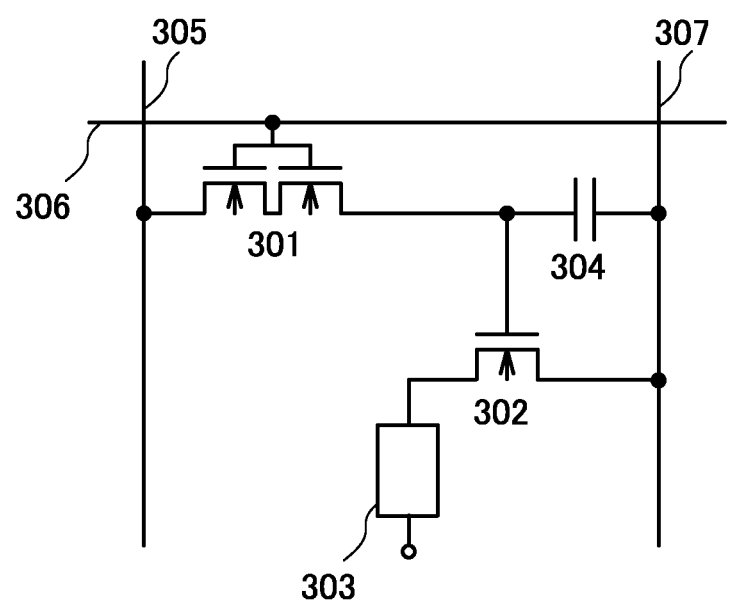
FIG. 15 illustrates an equivalent circuit of the semiconductor device illustrated in FIGS. 14A and 14B.

FIGS. 14A and 14B illustrate an active matrix light-emitting display device as an example of a semiconductor device. FIG. 14A is a plan view of the light-emitting display device, and FIG. 14B is a cross-sectional view taken along line Y-Z of FIG. 14A. FIG. 14A is a plan view of thin film transistors 301 and 302 and a first electrode layer 320 which are formed over a substrate 300. FIG. 15 shows an equivalent circuit of the light-emitting display device illustrated in FIGS. 14A and 14B.

The thin film transistors 301 and 302 used for the semiconductor device can be manufactured in a manner similar to any of the thin film transistors described in Embodiments 1 and 2. They are highly reliable thin film transistors each including an IGZO semiconductor layer and a buffer layer containing metal oxide having n-type conductivity.

The light-emitting display device of this embodiment illustrated in FIG. 14A and FIG. 15 includes the thin film transistor 301 with a multi-gate structure, the thin film transistor 302, a light-emitting element 303, a capacitor element 304, a source wiring layer 305, a gate wiring layer 306, and a power supply line 307. The thin film transistors 301 and 302 are n-channel thin film transistors.

In FIG. 14B, the light-emitting display device of this embodiment includes the thin film transistor 302, an insulating layer 311, an insulating layer 312, an insulating layer 313, a partition wall 321, and the light-emitting element 303 which includes a first electrode layer 320, an electroluminescent layer 322, and a second electrode layer 323.

The insulating layer 313 is preferably made of an organic resin such as acrylic, polyimide, or polyamide, or siloxane.

Since the thin film transistor 302 in the pixel is of an n-type in this embodiment, the first electrode layer 320 which is a pixel electrode layer functions as a cathode. Specifically, for the cathode, a material with a low work function, such as Ca, Al, MgAg, or AlLi can be used.

The partition wall 321 is made of an organic resin film, an inorganic insulating film, or organic polysiloxane. It is particularly preferable that the partition wall 321 be formed of a photosensitive material and have an opening over the first electrode layer 320, and a sidewall of the opening be formed as an inclined surface with continuous curvature.

The electroluminescent layer 322 may be formed using a single layer or a plurality of layers stacked.

The second electrode layer 323 used as an anode is formed to cover the electroluminescent layer 322. The second electrode layer 323 can be made of a light-transmitting conductive film using any of the light-transmitting conductive materials listed in Embodiment 4 for the pixel electrode layer. The second electrode layer 323 may also be formed of a titanium nitride film or a titanium film instead of the above light-transmitting conductive film. The light-emitting element 303 is formed by overlapping of the first electrode layer 320, the electroluminescent layer 322, and the second electrode layer 323. After that, a protective film may be formed over the second electrode layer 323 and the partition wall 321 in order to prevent entry of oxygen, hydrogen, moisture, carbon dioxide, or the like into the light-emitting element 303. As the protective film, a silicon nitride film, a silicon nitride oxide film, a DLC film, or the like can be formed.

Further, in a practical case, it is preferable that a display device completed to the state illustrated in FIG. 14B be packaged (sealed) with a protective film (such as a bonding film or an ultraviolet curable resin film) or a cover material with high air-tightness and little degasification so that the display device is not exposed to the outside air.

Next, structures of the light-emitting element will be described with reference to FIGS. 16A to 16C. A cross-sectional structure of a pixel will be described by taking an n-channel driving TFT as an example. Driving TFTs 7001, 7011, and 7021 used for semiconductor devices illustrated in FIGS. 16A to 16C can be manufactured in a manner similar to the thin film transistor described in Embodiment 1, which are highly reliable thin film transistors each including an IGZO semiconductor layer and a buffer layer containing metal oxide having n-type conductivity. Alternatively, the thin film transistor described in Embodiment 2 can be employed as the driving TFTs 7001, 7011, and 7021.

In order to extract light emitted from the light-emitting element, at least one of the anode and the cathode is required to transmit light. A thin film transistor and a light-emitting element are formed over a substrate. A light-emitting element can have a top emission structure in which light is extracted through the surface opposite to the substrate; a bottom emission structure in which light is extracted through the surface on the substrate side; or a dual emission structure in which light is extracted through the surface opposite to the substrate and the surface on the substrate side. The pixel structure of this embodiment can be applied to a light-emitting element having any of these emission structures.

A light-emitting element having a top emission structure will be described with reference to FIG. 16A.

Figure 16A:
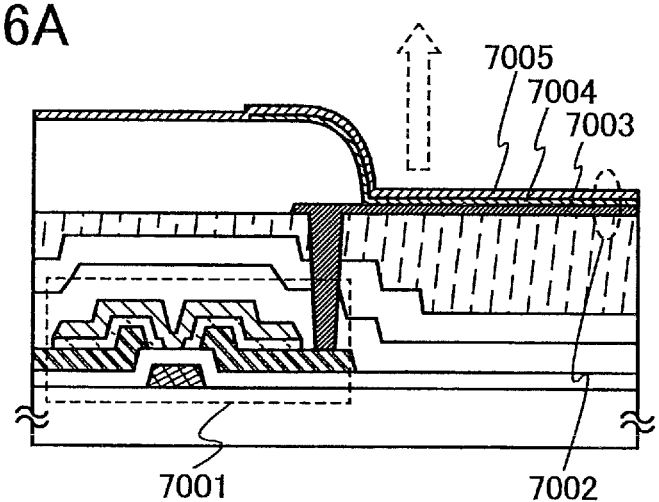
FIGS. 16A to 16C illustrate a semiconductor device according to one aspect of the present invention.

FIG. 16A is a cross-sectional view of a pixel in the case where the driving TFT 7001 is of an n-type and light is emitted from a light-emitting element 7002 to an anode 7005 side. In FIG. 16A, a cathode 7003 of the light-emitting element 7002 is electrically connected to the driving TFT 7001, and a light-emitting layer 7004 and the anode 7005 are stacked in this order over the cathode 7003. The cathode 7003 can be made of a variety of conductive materials which have a low work function and reflect light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. Not all of these layers need to be provided. The anode 7005 is made of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The light-emitting element 7002 corresponds to a region where the cathode 7003 and the anode 7005 sandwich the light-emitting layer 7004. In the case of the pixel illustrated in FIG. 16A, light is emitted from the light-emitting element 7002 to the anode 7005 side as indicated by an arrow.

Next, a light-emitting element having a bottom emission structure will be described with reference to FIG. 16B. FIG. 16B is a cross-sectional view of a pixel in the case where the driving TFT 7011 is of an n-type and light is emitted from a light-emitting element 7012 to a cathode 7013 side. In FIG. 16B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, various materials can be used, like in the case of FIG. 16A, as long as they are conductive materials having a low work function. Note that the cathode 7013 is formed to have a thickness with which the cathode 7013 transmit light (preferably, approximately 5 nm to 30 nm). For example, an aluminum film with a thickness of 20 nm can be used as the cathode 7013. Similarly to the case of FIG. 16A, the light-emitting layer 7014 may be formed using either a single layer or a plurality of layers stacked. The anode 7015 is not required to transmit light, but can be made of a light-transmitting conductive material like in the case of FIG. 16A. As the light-blocking film 7016, a metal that reflects light can be used for example; however, it is not limited to a metal film. For example, a resin to which black pigments are added can also be used.

The light-emitting element 7012 corresponds to a region where the cathode 7013 and the anode 7015 sandwich the light-emitting layer 7014. In the case of the pixel illustrated in FIG. 16B, light is emitted from the light-emitting element 7012 to the cathode 7013 side as indicated by an arrow.

Next, a light-emitting element having a dual emission structure will be described with reference to FIG. 16C. In FIG. 16C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. Like in the case of FIG. 16A, the cathode 7023 can be made of a variety of conductive materials which have a low work function. Note that the cathode 7023 is formed to have a thickness with which the cathode 7023 can transmit light. For example, a film of Al having a thickness of 20 nm can be used as the cathode 7023. Like in FIG. 16A, the light-emitting layer 7024 may be formed using either a single layer or a plurality of layers stacked. The anode 7025 can be made of a light-transmitting conductive material like in the case of FIG. 16A.

The light-emitting element 7022 corresponds to a region where the cathode 7023, the light-emitting layer 7024, and the anode 7025 overlap. In the case of the pixel illustrated in FIG. 16C, light is emitted from the light-emitting element 7022 to both the anode 7025 side and the cathode 7023 side as indicated by arrows.

Although an organic EL element is described here as a light-emitting element, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 16B:
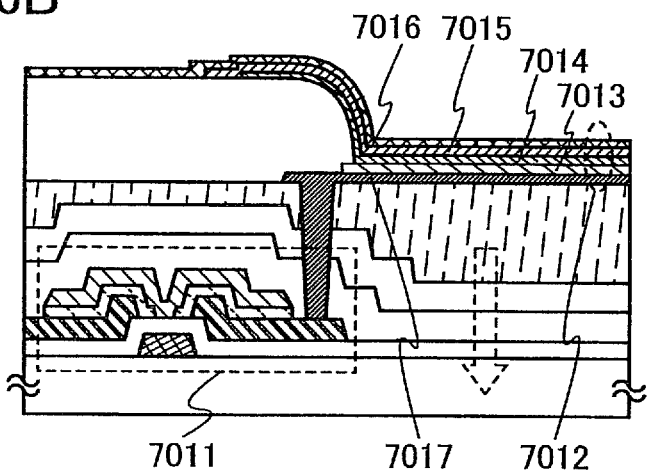
Figure 16C:
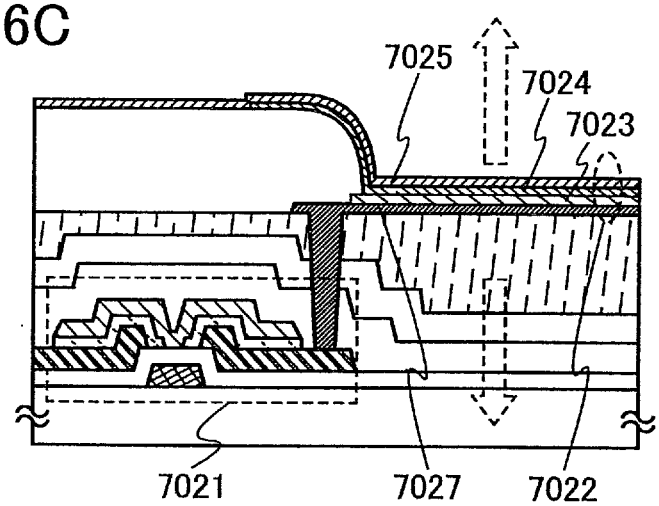

The structure of the semiconductor device described in this embodiment is not limited to those illustrated in FIGS. 16A to 16C and can be modified as appropriate.

Through the above process, a highly reliable light-emitting display device as a semiconductor device can be manufactured.

This embodiment can be implemented in appropriate combination with the structures described in any of Embodiments 1 to 3.

(Embodiment 7)

In this embodiment, a structure of a display panel which is one example of the semiconductor device will be described. In this embodiment, a liquid crystal display panel (also referred to as a liquid crystal panel), which is one embodiment of a liquid crystal display device having a liquid crystal element as a display element, and a light-emitting display panel (also referred to as a light-emitting panel), which is one embodiment of a semiconductor device having a light-emitting element as a display element, will be described.

Figure 17A:
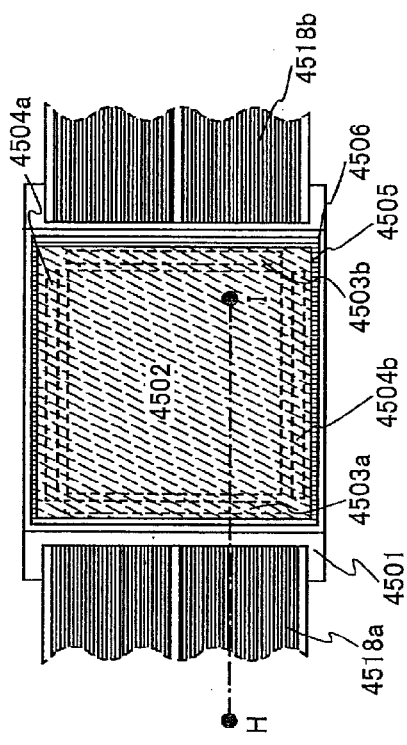
FIGS. 17A and 17B illustrate a semiconductor device according to one aspect of the present invention.
Figure 17B:
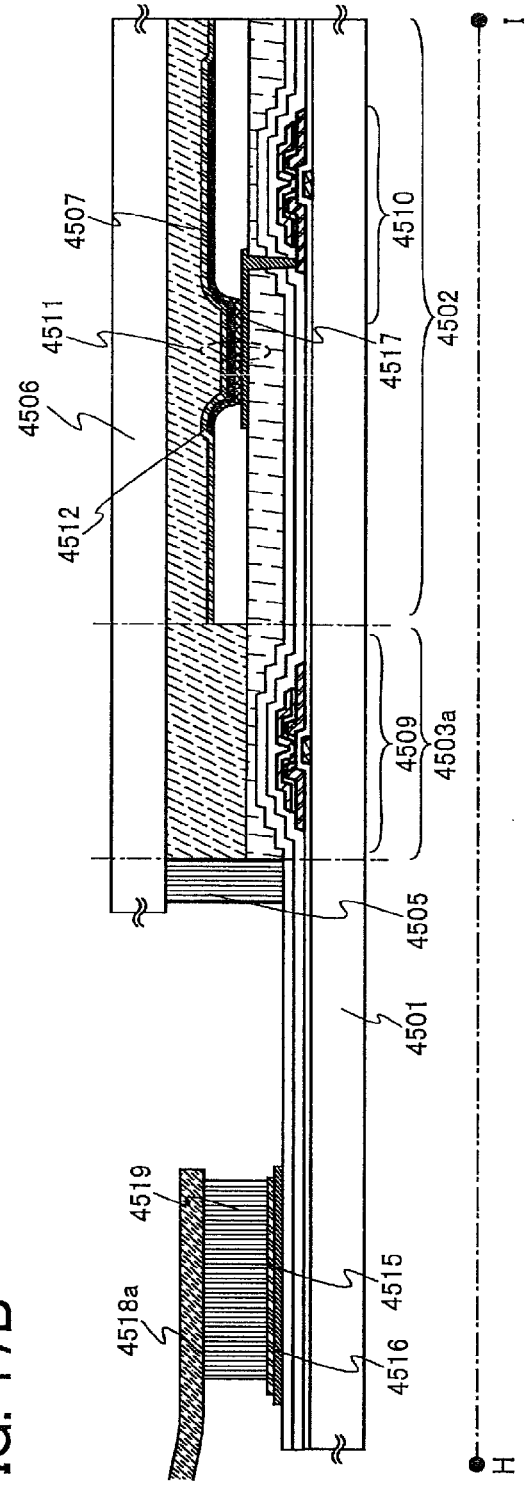

First, the appearance and a cross section of a light-emitting display panel, which is one embodiment of the semiconductor device, will be described with reference to FIGS. 17A and 17B. FIG. 17A is a top view of a panel in which a highly reliable thin film transistor including an IGZO semiconductor layer and a buffer layer containing metal oxide having n-type conductivity and a light-emitting element are sealed between a first substrate and a second substrate with a sealant. FIG. 17B is a cross-sectional view taken along line H-I of FIG. 17A.

A sealant 4505 is provided to surround a pixel portion 4502, signal line driver circuits 4503a and 4503b, and scanning line driver circuits 4504a and 4504b, which are provided over a first substrate 4501. In addition, a second substrate 4506 is provided over the pixel portion 4502, the signal line driver circuits 4503a and 4503b, and the scanning line driver circuits 4504a and 4504b. Accordingly, the pixel portion 4502, the signal line driver circuits 4503a and 4503b, and the scanning line driver circuits 4504a and 4504b are sealed together with a filler 4507, by the first substrate 4501, the sealant 4505, and the second substrate 4506.

The pixel portion 4502, the signal line driver circuits 4503a and 4503b, and the scanning line driver circuits 4504a and 4504b formed over the first substrate 4501 each include a plurality of thin film transistors. A thin film transistor 4510 included in the pixel portion 4502 and a thin film transistor 4509 included in the signal line driver circuit 4503a are illustrated as an example in FIG. 17B.

Each of the thin film transistors 4509 and 4510 corresponds to a thin film transistor having an IGZO semiconductor layer and a buffer layer containing metal oxide having n-type conductivity, and any of the thin film transistors described in Embodiment 1 or 2 can be employed as the thin film transistors 4509 and 4510. In this embodiment, the thin film transistors 4509 and 4510 are n-channel thin film transistors.

Moreover, reference numeral 4511 denotes a light-emitting element. A first electrode layer 4517 that is a pixel electrode included in the light-emitting element 4511 is electrically connected to a source electrode layer or a drain electrode layer of the thin film transistor 4510. Note that a structure of the light-emitting element 4511 is not limited to that described in this embodiment. The structure of the light-emitting element 4511 can be changed as appropriate depending on the direction in which light is extracted from the light-emitting element 4511, or the like.

In addition, a variety of signals and a potential are supplied to the signal line driver circuits 4503a and 4503b, the scanning line driver circuits 4504a and 4504b, or the pixel portion 4502 from FPCs 4518a and 4518b.

In this embodiment, a connection terminal 4515 is formed using the same conductive film as that of the second electrode layer 4512, and a wiring 4516 is formed using the same conductive film as that of the first electrode layer 4517 included in the light-emitting element 4511.

The connection terminal 4515 is electrically connected to a terminal of the FPC 4518a through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermo-setting resin can be used, in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. In this embodiment, nitrogen is used for the filler 4507.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scanning line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scanning line driver circuits or part thereof may be separately formed and mounted. This embodiment is not limited to the structure illustrated in FIGS. 17A and 17B.

Figure 18A:
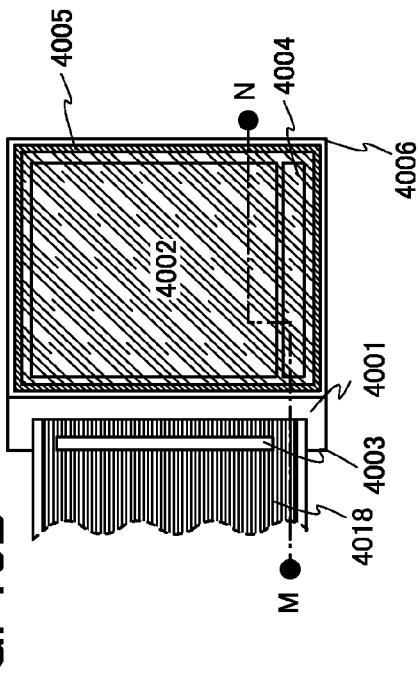
FIGS. 18A to 18C illustrate a semiconductor device according to one aspect of the present invention.
Figure 18B:
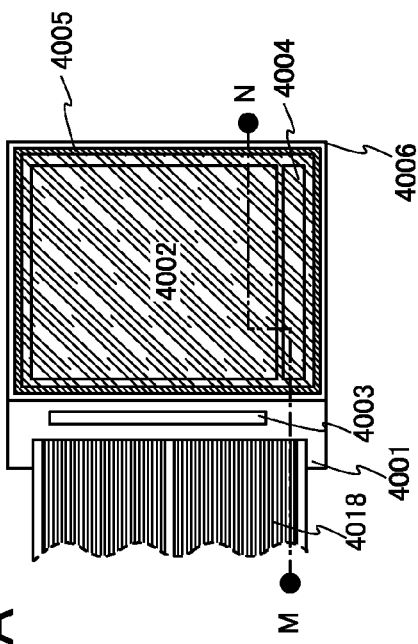
Figure 18C:
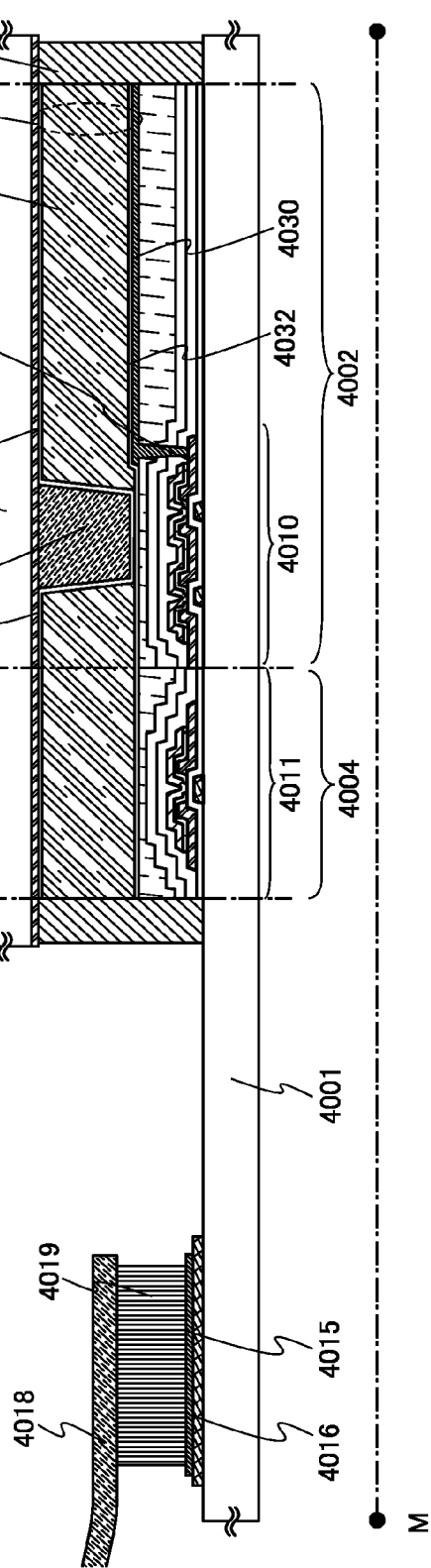

Next, the appearance and a cross section of a liquid crystal display panel, which is one embodiment of the present invention, will be described with reference to FIGS. 18A to 18C. FIGS. 18A and 18B are top views of panels in which highly reliable thin film transistors 4010 and 4011 each including an IGZO semiconductor layer and a buffer layer containing metal oxide having n-type conductivity, and a liquid crystal element 4013 are sealed between a first substrate 4001 and a second substrate 4006 with a sealant 4005. FIG. 18C is a cross-sectional view taken along line M-N of FIGS. 18A and 18B.

The sealant 4005 is provided to surround a pixel portion 4002 and a scanning line driver circuit 4004 that are provided over the first substrate 4001. The second substrate 4006 is provided over the pixel portion 4002 and the scanning line driver circuit 4004. Therefore, the pixel portion 4002 and the scanning line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted over the first substrate 400 in a region different from the region surrounded by the sealant 4005.

Note that there is no particular limitation on the connection method of a driver circuit which is separately formed, and a COG method, a wire bonding method, a TAB method, or the like can be used. FIG. 18A illustrates an example of mounting the signal line driver circuit 4003 by a COG method, and FIG. 18B illustrates an example of mounting the signal line driver circuit 4003 by a TAB method.

The pixel portion 4002 and the scanning line driver circuit 4004 provided over the first substrate 4001 each include a plurality of thin film transistors. FIG. 18C illustrates the thin film transistor 4010 included in the pixel portion 4002 and the thin film transistor 4011 included in the scanning line driver circuit 4004.

Each of the thin film transistors 4010 and 4011 corresponds to a thin film transistor including an IGZO semiconductor layer and a buffer layer containing metal oxide having n-type conductivity, and any of the thin film transistors described in Embodiment 1 or 2 can be employed as the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is provided with the second substrate 4006. A portion where the pixel electrode layer 4030, the counter electrode layer 4031, and the liquid crystal layer 4008 overlap corresponds to the liquid crystal element 4013. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be made of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films can be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may be used.

Further, a variety of signals and a potential are supplied to the signal line driver circuit 4003 that is formed separately, the scanning line driver circuit 4004, or the pixel portion 4002 from an FPC 4018.

In this embodiment, a connection terminal 4015 is formed using the same conductive film as that of the pixel electrode layer 4030 included in the liquid crystal element 4013, and a wiring 4016 is formed using the same conductive film as that of gate electrode layers of the thin film transistors 4010 and 4011.

The connection terminal 4015 is electrically connected to a terminal included in the FPC 4018 through an anisotropic conductive film 4019.

Note that FIGS. 18A to 18C illustrate an example in which the signal line driver circuit 4003 is formed separately and mounted on the first substrate 4001; however, this embodiment is not limited to this structure. The scanning line driver circuit may be separately formed and then mounted, or only part of the signal line driver circuit or part of the scanning line driver circuit may be separately formed and then mounted.

Figure 19:
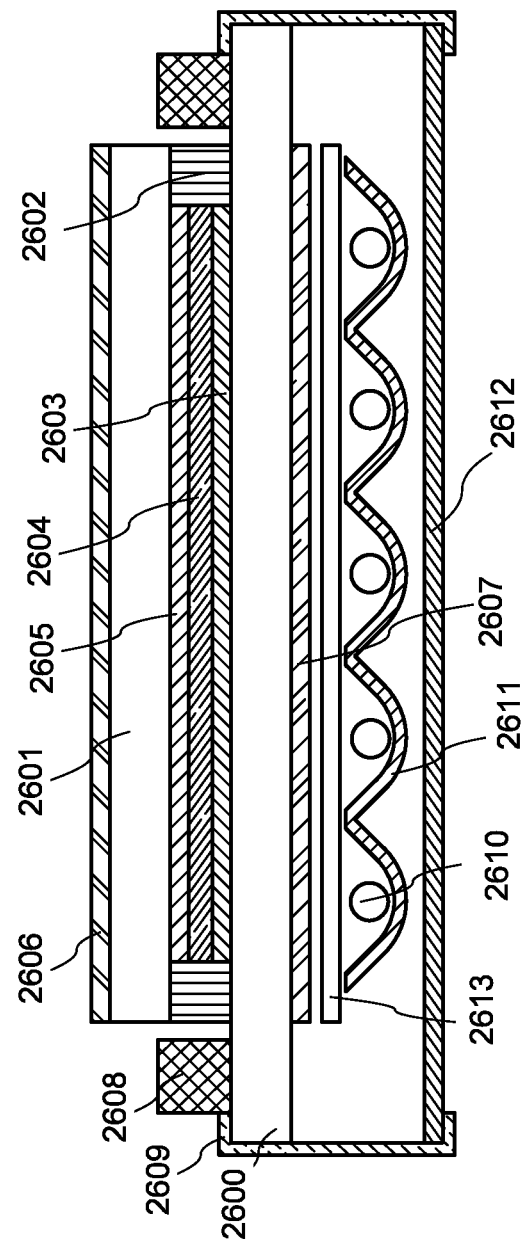
FIG. 19 illustrates a semiconductor device according to one aspect of the present invention.

FIG. 19 illustrates an example of a liquid crystal display module which is formed using a TFT substrate 2600 manufactured according to the above embodiments.

FIG. 19 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, coloring layers corresponding to colors of red, green, and blue are provided for pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be employed.

Through the above process, highly reliable display panel as a semiconductor device can be manufactured.

This embodiment can be implemented in appropriate combination with the structures described in any of Embodiments 1 to 6.

(Embodiment 8)

A semiconductor device which is one embodiment of the present invention can be applied to an electronic paper. An electronic paper can be used for any electronic appliances of a variety of fields which can display information. For example, an electronic paper can be applied to an e-book reader (an electronic book reader), a poster, a transportation advertisement in a vehicle such as a train, displays of various cards such as a credit card, and the like. Examples of the electronic appliances in which an electronic paper is used are illustrated in FIGS. 20A and 20B and FIG. 21.

Figure 20A:
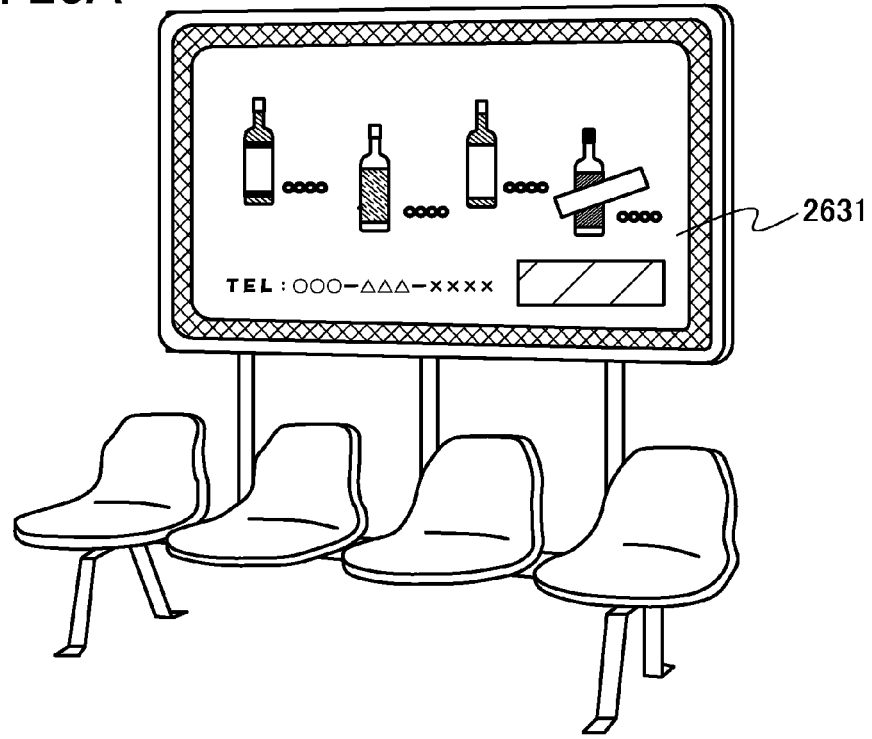
FIGS. 20A and 20B each illustrate a usage pattern of an electronic paper.

FIG. 20A illustrates a poster 2631 using an electronic paper. In the case where an advertising medium is printed paper, the advertisements are replaced by hands; however, by using an electronic paper to which the above embodiment is applied, the advertisements can be changed in a short time. Further, stable images can be obtained without display defects. Note that the poster may have a configuration capable of wirelessly transmitting and receiving data.

Figure 20B:
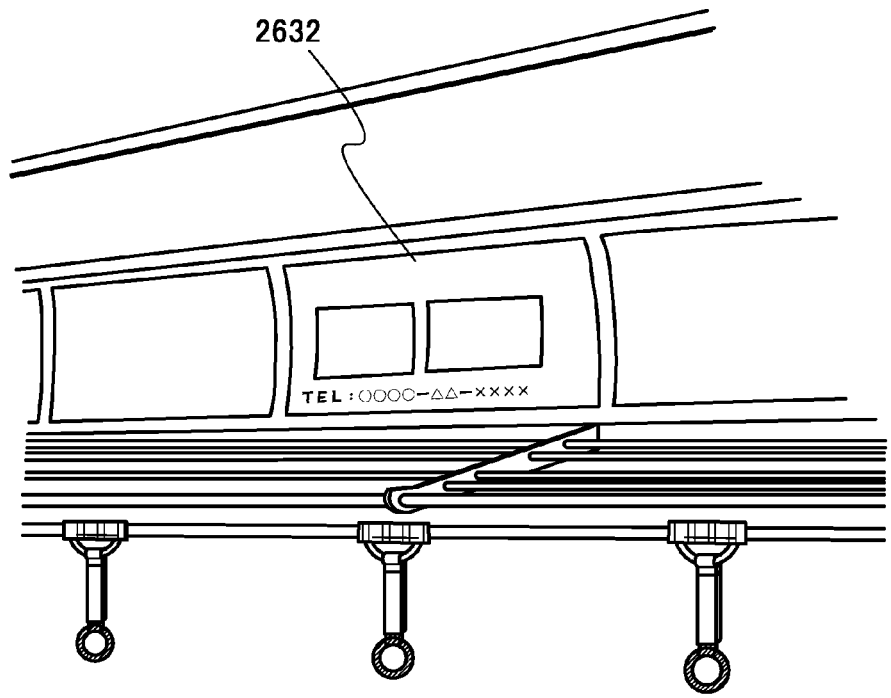

FIG. 20B illustrates an advertisement 2632 in a vehicle such as a train. In the case where an advertising medium is printed paper, the advertisements are replaced by hands; however, by using an electronic paper to which the above embodiment is applied, the advertisements can be changed in a short time with less manpower. Further, stable images can be obtained without display defects. Note that the advertisement 2632 in a vehicle may have a configuration capable of wirelessly transmitting and receiving data.

Figure 21:
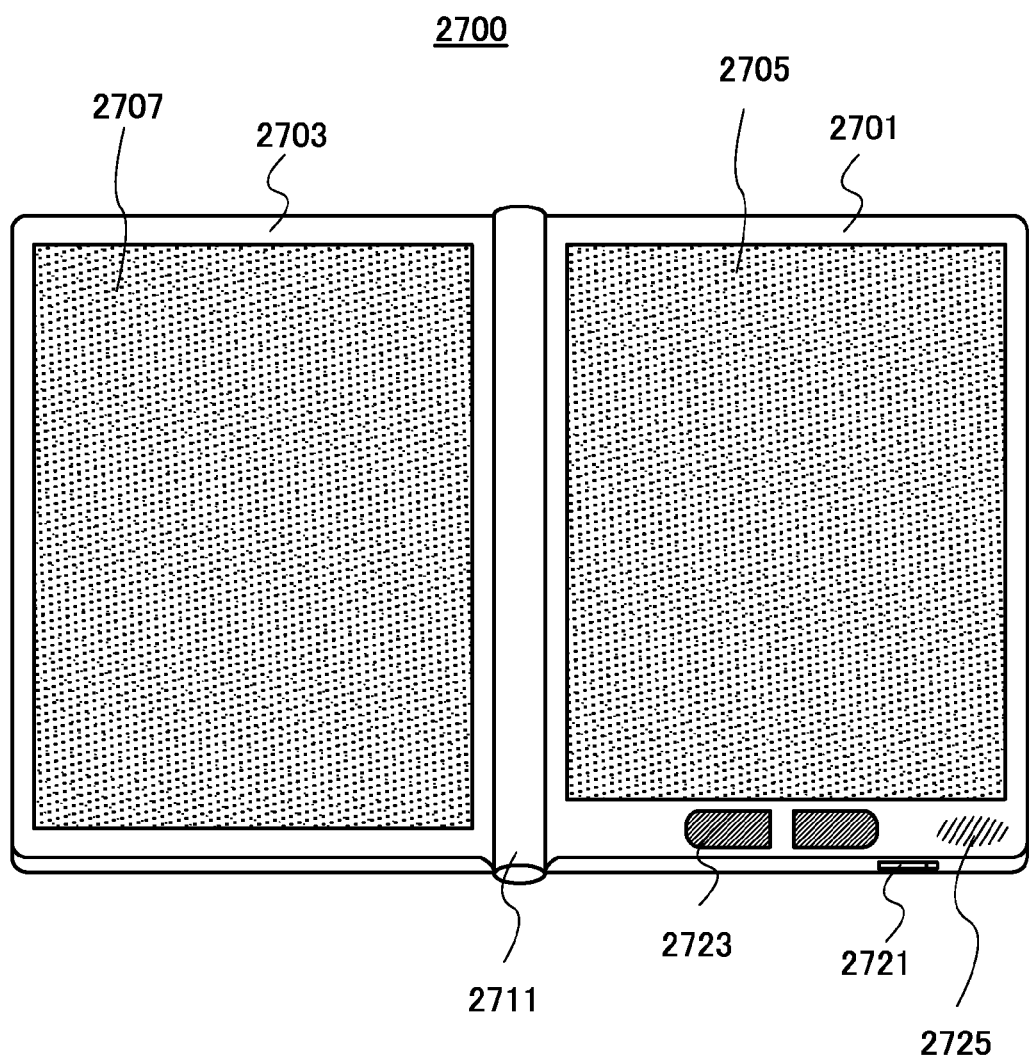
FIG. 21 illustrates an example of an e-book reader.

FIG. 21 illustrates an example of an e-book reader 2700. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can be handled like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 21) and graphics can be displayed on a display portion on the left side (the display portion 2707 in FIG. 21).

FIG. 21 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Further, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

This embodiment can be implemented in appropriate combination with the structures described in any one of Embodiments 1 to 3 or Embodiment 5.

(Embodiment 9)

A semiconductor device of Embodiments 1 to 8 can be applied to a variety of electronic appliances (including an amusement machine). Examples of electronic appliances are a television set (also referred to as a television or a television receiver), a monitor of a computer or the like, a camera such as a digital camera or a digital video camera, a digital photo frame, a cellular phone (also referred to as a mobile phone or a mobile phone set), a portable game console, a portable information terminal, an audio reproducing device, a large-sized game machine such as a pachinko machine, and the like.

Figure 22A:
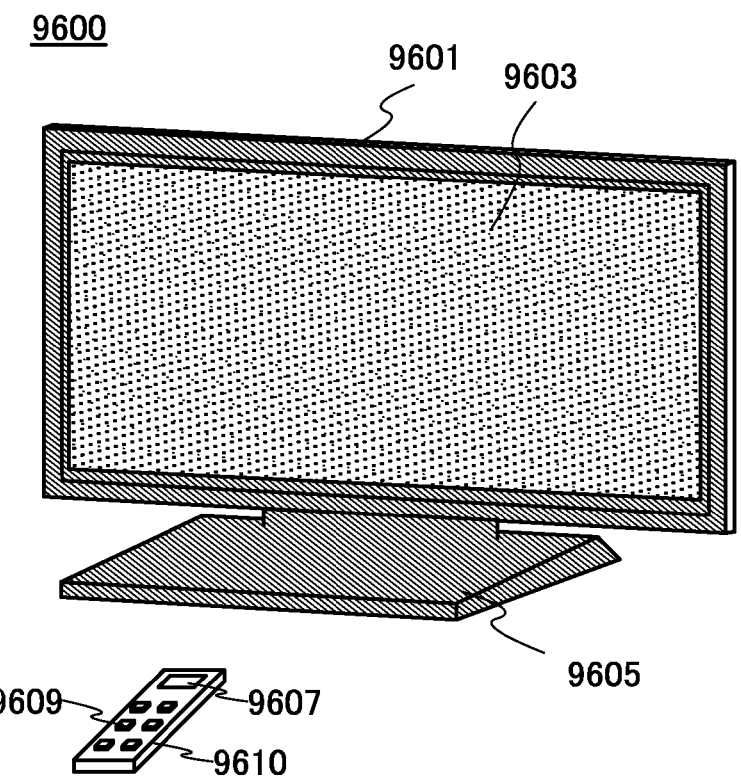
FIG. 22A illustrates an example of a television device and FIG. 22B illustrates a digital photo frame.

FIG. 22A illustrates an example of a television set 9600. In the television set 9600, a display portion 9603 is incorporated in a housing 9601. Images can be displayed on the display portion 9603. Further, the housing 9601 is supported by a stand 9605 here.

The television set 9600 can be operated by an operation switch of the housing 9601 or a separate remote controller 9610. Channels and volume can be controlled by an operation key 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver, between receivers, or the like) data communication can be performed.

Figure 22B:
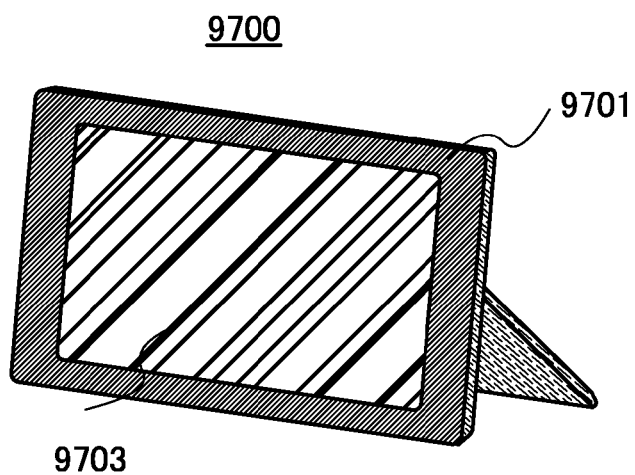

FIG. 22B illustrates an example of a digital photo frame 9700. For example, in the digital photo frame 9700, a display portion 9703 is incorporated in a housing 9701. Various images can be displayed on the display portion 9703. For example, the display portion 9703 can display data of an image taken by a digital camera or the like to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory storing data of an image taken by a digital camera is inserted in the recording medium insertion portion of the digital photo frame, whereby the image data can be downloaded and displayed on the display portion 9703.

The digital photo frame 9700 may have a configuration capable of wirelessly transmitting and receiving data. Through wireless communication, desired image data can be downloaded to be displayed.

Figure 23A:
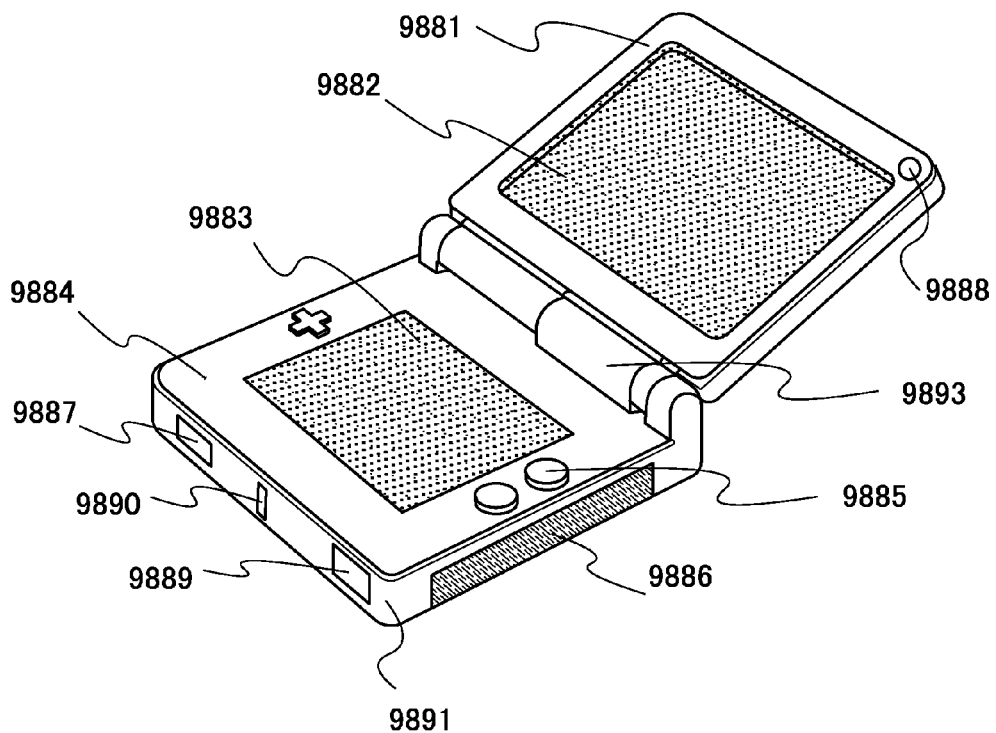
FIGS. 23A and 23B each illustrate an example of an amusement machine.

FIG. 23A is a portable amusement machine including two housings, a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 23A includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and a structure provided with at least a semiconductor device of the above embodiment may be employed. The portable amusement machine may include other accessory equipment as appropriate. The portable amusement machine illustrated in FIG. 23A has a function of reading a program or data stored in a recording medium to display it on the display portion, and a function of sharing information with another portable amusement machine via wireless communication. The portable amusement machine illustrated in FIG. 23A can have various functions without limitation to the above.

Figure 23B:
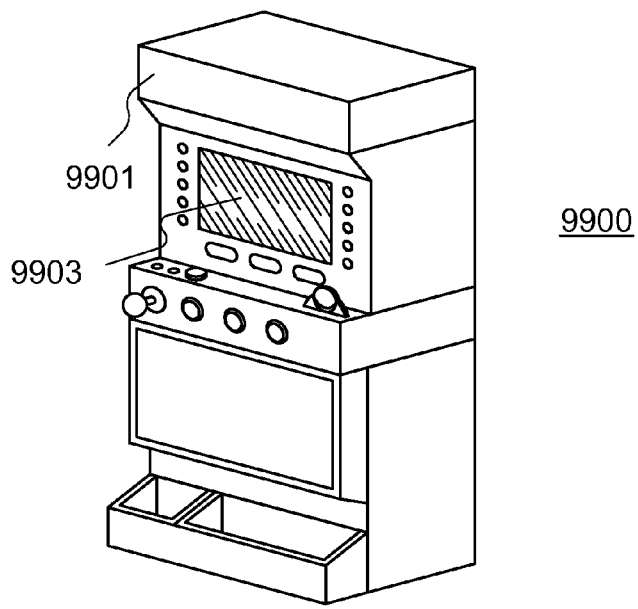

FIG. 23B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and a structure provided with at least a semiconductor device of the above embodiment may be employed. The slot machine 9900 may include other accessory equipment as appropriate.

Figure 24:
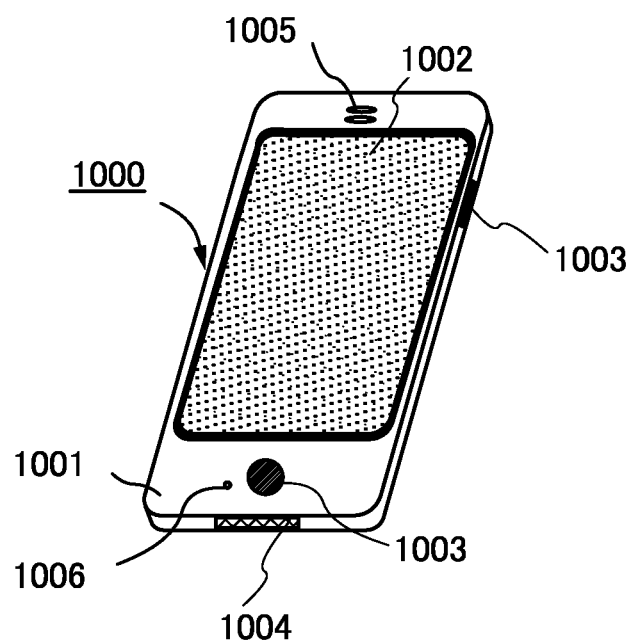
FIG. 24 illustrates an example of a mobile phone.

FIG. 24 illustrates an example of a cellular phone 1000. The cellular phone 1000 is provided with a display portion 1002 incorporated in a housing 1001, operation buttons 1003, an external connection port 1004, a speaker 1005, a microphone 1006, and the like.

When the display portion 1002 of the cellular phone 1000 illustrated in FIG. 24 is touched with a finger or the like, data can be input into the mobile phone 1000. Further, operations such as making calls and composing mails can be performed by touching the display portion 1002 with a finger or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be input. In that case, it is preferable to display a keyboard or number buttons on almost all the area of the screen of the display portion 1002.

When a detection device including a sensor for detecting inclination, such as a gyroscope or an acceleration sensor, is provided inside the cellular phone 1000, display on the screen of the display portion 1002 can be automatically switched by determining the direction of the cellular phone 1000 (whether the cellular phone 1000 is placed horizontally or vertically for a landscape mode or a portrait mode).

The screen modes are switched by touching the display portion 1002 or operating the operation buttons 1003 of the housing 1001. Alternatively, the screen modes may be switched depending on the kind of images displayed on the display portion 1002. For example, when a signal of an image displayed on the display portion is of moving image data, the screen mode is switched to the display mode. When the signal is of text data, the screen mode is switched to the input mode.

Further, in the input mode, a signal is detected by the optical sensor in the display portion 1002 and if input by touching the display portion 1002 is not performed for a certain period, the screen mode may be controlled so as to be switched from the input mode to the display mode.

The display portion 1002 may function as an image sensor. For example, an image of a palm print, a fingerprint, or the like is taken by touching the display portion 1002 with the palm or the finger, whereby personal authentication can be performed. Further, by providing a backlight or sensing light source emitting a near-infrared light for the display portion, an image of a finger vein, a palm vein, or the like can also be taken.

This application is based on Japanese Patent Application serial No. 2008-205968 filed with Japan Patent Office on Aug. 8, 2008, the entire contents of which are hereby incorporated by reference.

What is claimed is:

1. A method for manufacturing a semiconductor device comprising:

forming a first conductive layer over a substrate;

forming an insulating layer over the first conductive layer;

forming a second conductive layer and a third conductive layer over the insulating layer;

forming a first layer over the second conductive layer and a second layer over the third conductive layer; and forming a semiconductor layer over the first layer and the second layer, wherein the semiconductor layer includes indium and oxygen, wherein each of the first layer and the second layer includes a metal oxide having n-type conductivity, and wherein each of the first layer and the second layer has a higher carrier concentration than the semiconductor layer.

2. The method for manufacturing a semiconductor device according to claim 1, wherein a part of the semiconductor layer overlapping with the first conductive layer is over and in contact with the insulating layer and is provided between the second conductive layer and the third conductive layer.

3. The method for manufacturing a semiconductor device according to claim 1, wherein the second conductive layer and the third conductive layer includes titanium.

4. The method for manufacturing a semiconductor device according to claim 1, wherein each of the first layer and the second layer includes an impurity element imparting n-type conductivity, and wherein the impurity element is selected from the group consisting of indium, gallium, aluminum, tin, and zinc.

5. The method for manufacturing a semiconductor device according to claim 1, wherein the metal oxide in the first layer and the second layer is selected from the group consisting of titanium oxide, molybdenum oxide, zinc oxide, indium oxide, tungsten oxide, magnesium oxide, calcium oxide, or tin oxide.

6. The method for manufacturing a semiconductor device according to claim 1, wherein the semiconductor layer is formed by a sputtering method.

7. The method for manufacturing a semiconductor device according to claim 6, wherein the sputtering method is performed under an oxygen atmosphere or an atmosphere containing oxygen at 90% or higher and a rare gas at 10% or lower.

8. The method for manufacturing a semiconductor device according to claim 1, wherein the second conductive layer and the third conductive layer are formed by a screen printing method of an ink jet method.

9. A method for manufacturing a semiconductor device comprising:

forming a first conductive layer over a substrate;

forming an insulating layer over the first conductive layer;

forming a second conductive layer and a third conductive layer over the insulating layer by a screen printing method of an ink jet method; and forming a semiconductor layer over the second conductive layer and the third conductive layer, wherein the semiconductor layer is formed by a sputtering method, wherein the sputtering method is performed under an oxygen atmosphere or an atmosphere containing oxygen at 90% or higher and a rare gas at 10% or lower, and wherein the semiconductor layer includes indium and oxygen.

10. The method for manufacturing a semiconductor device according to claim 9, wherein a part of the semiconductor layer overlapping with the first conductive layer is over and in contact with the insulating layer and is provided between the second conductive layer and the third conductive layer.

11. The method for manufacturing a semiconductor device according to claim 9, wherein the second conductive layer and the third conductive layer includes titanium.

12. A method for manufacturing a semiconductor device comprising:

forming a first conductive layer over a substrate;

forming an insulating layer over the first conductive layer;

forming a second conductive layer and a third conductive layer over the insulating layer;

forming a first layer over the second conductive layer and a second layer over the third conductive layer;

forming a third layer over the first layer and a fourth layer over the second layer; and forming a semiconductor layer over the first layer and the second layer, wherein the semiconductor layer includes indium and oxygen, wherein each of the first layer and the second layer includes a metal oxide having n-type conductivity, and wherein each of the first layer and the second layer has a higher carrier concentration than the semiconductor layer.

13. The method for manufacturing a semiconductor device according to claim 12, wherein a part of the semiconductor layer overlapping with the first conductive layer is over and in contact with the insulating layer and is provided between the second conductive layer and the third conductive layer.

14. The method for manufacturing a semiconductor device according to claim 12, wherein the second conductive layer and the third conductive layer includes titanium.

15. The method for manufacturing a semiconductor device according to claim 12, wherein each of the first layer and the second layer includes an impurity element imparting n-type conductivity, and wherein the impurity element is selected from the group consisting of indium, gallium, aluminum, tin, and zinc.

16. The method for manufacturing a semiconductor device according to claim 12, wherein the metal oxide in the first layer and the second layer is selected from the group consisting of titanium oxide, molybdenum oxide, zinc oxide, indium oxide, tungsten oxide, magnesium oxide, calcium oxide, or tin oxide.

17. The method for manufacturing a semiconductor device according to claim 12, wherein the semiconductor layer is formed by a sputtering method.

18. The method for manufacturing a semiconductor device according to claim 17, wherein the sputtering method is performed under an oxygen atmosphere or an atmosphere containing oxygen at 90% or higher and a rare gas at 10% or lower.

19. The method for manufacturing a semiconductor device according to claim 12, wherein the second conductive layer and the third conductive layer are formed by a screen printing method of an ink jet method.

* * * * *

UNITED STATES PATENT AND TRADEMARK OFFICE
CERTIFICATE OF CORRECTION

PATENT NO. : 8,481,363 B2  
APPLICATION NO. : 13/227585  
DATED : July 9, 2013  
INVENTOR(S) : Shunpei Yamazaki et al.

Page 1 of 1

It is certified that error appears in the above-identified patent and that said Letters Patent is hereby corrected as shown below:

In the Specification:

Column 13, line 32, "56214" should be -- 5621-J --;

Column 13, line 41, "57214" should be -- 5721-J --;

Column 13, line 41, "56214" should be -- 5621-J --;

Column 13, line 46, "56214" should be -- 5621-J --;

Column 13, line 48, "56214" should be -- 5621-J --;

Column 13, line 59, "56214" should be -- 5621-J --;

Column 13, line 64, "56214" should be -- 5621-J --;

Column 14, line 2, "56214" should be -- 5621-J --;

Column 14, line 38, "58214" should be -- 5821-J --.

Signed and Sealed this  
First Day of October, 2013

Teresa Stanek Rea  
*Deputy Director of the United States Patent and Trademark Office*